(12) United States Patent
Jung et al.

(10) Patent No.: US 12,139,652 B2
(45) Date of Patent: Nov. 12, 2024

(54) QUANTUM DOT, AND INK COMPOSITION, LIGHT-EMITTING DEVICE, OPTICAL MEMBER, AND APPARATUS INCLUDING QUANTUM DOT

(71) Applicants: Samsung Display Co., Ltd., Yongin-si (KR); NIC LAB Co.,LTD., Ansan-si (KR)

(72) Inventors: Yunku Jung, Yongin-si (KR); Changhee Lee, Yongin-si (KR); Hanyoung Choi, Ansan-si (KR); Yunhyuk Ko, Yongin-si (KR); Changho Cho, Ansan-si (KR); Jaekook Ha, Yongin-si (KR)

(73) Assignees: Samsung Display Co., Ltd., Yongin-si (KR); NIC Lab Co., Ltd., Ansan-si (KR)

( * ) Notice: Subject to any disclaimer, the term of this patent is extended or adjusted under 35 U.S.C. 154(b) by 519 days.

(21) Appl. No.: 17/450,252

(22) Filed: Oct. 7, 2021

(65) Prior Publication Data

US 2022/0112425 A1    Apr. 14, 2022

(30) Foreign Application Priority Data

Oct. 14, 2020  (KR) .................. 10-2020-0132974

(51) Int. Cl.
| | |
|---|---|
| *C09K 11/02* | (2006.01) |
| *B82Y 20/00* | (2011.01) |
| *B82Y 40/00* | (2011.01) |
| *C09D 5/22* | (2006.01) |
| *C09D 11/037* | (2014.01) |
| *C09D 11/50* | (2014.01) |
| *C09D 11/52* | (2014.01) |
| *C09K 11/08* | (2006.01) |
| *C09K 11/88* | (2006.01) |
| *H01L 33/50* | (2010.01) |
| *H10K 50/115* | (2023.01) |

(52) U.S. Cl.
CPC .............. *C09K 11/025* (2013.01); *C09D 5/22* (2013.01); *C09D 11/037* (2013.01); *C09D 11/50* (2013.01); *C09D 11/52* (2013.01); *C09K 11/0883* (2013.01); *C09K 11/883* (2013.01); *H01L 33/502* (2013.01); *H10K 50/115* (2023.02); *B82Y 20/00* (2013.01); *B82Y 40/00* (2013.01)

(58) Field of Classification Search
CPC .............. C09K 11/025; C09K 11/0881; C09K 11/883; H10K 50/115; H01L 33/502; C09D 5/22; C09D 11/037; C09D 11/50; C09D 11/52

See application file for complete search history.

(56) References Cited

U.S. PATENT DOCUMENTS

2015/0315460 A1* 11/2015 Gim .................. H10K 85/6572
977/774

FOREIGN PATENT DOCUMENTS

| JP | 2010-209141 A | 9/2010 |
|---|---|---|
| KR | 10-2012-0028670 A | 3/2012 |
| KR | 10-1740429 B1 | 5/2017 |

OTHER PUBLICATIONS

Chen, Wei et al., "Pyrene-Functionalized Ruthenium Nanoparticles: Novel Fluorescence Characteristics from Intraparticle Extended Conjugation", J. Phys. Chem. C 2009, 113, 16988-16995.*
Amelia, Matteo et al., "A ratiometric luminescent oxygen sensor based on a chemically functionalized quantum dot", Chem. Commun., (2011) 47, 325-327 (3 pages); DOI: 10.1039/c0cc02163f.

(Continued)

*Primary Examiner* — C Melissa Koslow
(74) *Attorney, Agent, or Firm* — Lewis Roca Rothgerber Christie LLP

(57) ABSTRACT

A quantum dot includes: a nanoparticle; and a ligand represented by Formula 1 on a surface of the nanoparticle:

Formula 1

$$(R_1)_{d1}\text{-pyrene-}[(Y_1)_{a1}-(L_1)_{b1}-(Y_2)_{a2}-(L_2)_{b2}]_{c1}A_1.$$

$A_1$ is an anchoring group linked to the surface of the nanoparticle, and $A_1$ may be selected from groups represented by Formulae A-1 to A-4:

A-1: *—SH

A-2: *—CH(SH)—CH$_2$—SH

A-3: *—C(=S)—SH

A-4: *—C(=O)—OH, wherein * in Formulae A-1 to A-4 indicates a binding site to a neighboring atom.

20 Claims, 14 Drawing Sheets

(56) References Cited

OTHER PUBLICATIONS

Brown, Patrick R. et al., "Energy Level Modification in Lead Sulfide Quantum Dot Thin Films through Ligand Exchange", ACS Nano, 8(6), 5863-5872 (2014) (10 pages).
Chen, Wei et al., "Pyrene-Functionalized Ruthenium Nanoparticles: Novel Fluorescence Characteristics from Intraparticle Extended Conjugation", J. Phys. Chem. C 2009, 113, 16988-16995 (8 pages).
Chuang, Chia-Hao M. et al., "Improved performance and stability in quantum dot solar cells through band alignment engineering", Nature Materials, 13(8), 796-801 (2014) (6 pages); DOI: 10.1038/NMAT3984.
Gonzalez-Carrero, Soranyel et al., "Pyrene-Capped CdSe@ZnS Nanoparticles as Sensitive Flexible Oxygen Sensors in Non-Aqueous Media**", ChemistryOpen, 3(5), 199-205 (2014) (7 pages); DOI: 10.1002/open.201402021.
La Rosa, Marcello et al., "Designed Long-Lived Emission from CdSe Quantum Dots through Reversible Electronic Energy Transfer with a Surface-Bound Chromophore", Angew. Chem. (2018) 130, 3158-3161 (4 pages); DOI: 10.1002/anie.201712403.

\* cited by examiner

QUANTUM DOT, AND INK COMPOSITION, LIGHT-EMITTING DEVICE, OPTICAL MEMBER, AND APPARATUS INCLUDING QUANTUM DOT

CROSS-REFERENCE TO RELATED APPLICATION(S)

This application claims priority to and the benefit of Korean Patent Application No. 10-2020-0132974, filed on Oct. 14, 2020, in the Korean Intellectual Property Office, the entire content of which is incorporated herein by reference.

BACKGROUND

1. Field

One or more embodiments relate to a quantum dot. One or more embodiments may include an ink composition, a light-emitting device, an optical member, and an apparatus, each of which includes the quantum dot.

2. Description of Related Art

Quantum dots are nanocrystals of semiconductor materials and exhibit a quantum confinement effect. When quantum dots reach an energy excited state by receiving light from an excitation source, the quantum dots emit energy according to a corresponding energy band gap by themselves. In this regard, even with the same material, the wavelength varies according to the particle size, and accordingly, by adjusting the size of the quantum dots, light having a desired wavelength range may be obtained, and excellent color purity and high luminescence efficiency may be obtained. Thus, the quantum dots may be applicable to various devices.

In addition, quantum dots may be used as materials that perform various optical functions (for example, a photoconversion function) in optical members. Quantum dots, as nano-sized semiconductor nanocrystals, may have different energy band gaps by adjusting the size and composition of the nanocrystals, and thus may emit light of various emission wavelengths.

An optical member including such quantum dots may have the form of a thin film, for example, a thin film patterned for each subpixel. Such an optical member may be used as a color conversion member of a device including various light sources.

SUMMARY

One or more aspects of embodiments of the present disclosure are directed toward a quantum dot in which a surface of the quantum dot is modified by a ligand having better charge injection properties than a ligand of the related art that may interfere with charge injection. One or more embodiments may include an ink composition, a light-emitting device, an optical member, and an apparatus that use the quantum dot.

Additional aspects will be set forth in part in the description which follows and, in part, will be apparent from the description, or may be learned by practice of the presented embodiments of the disclosure.

According to one or more embodiments, a quantum dot includes a nanoparticle, and a ligand that is represented by Formula 1 on a surface of the nanoparticle.

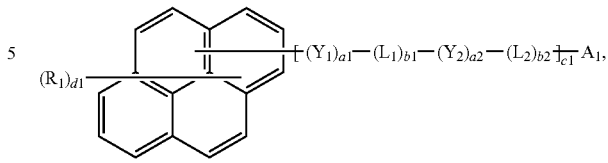

Formula 1 wherein, in Formula 1, $A_1$ is a group including a thiol moiety, a bidentate thiol moiety, a dithio acid moiety, and/or a carboxylic acid moiety, $Y_1$ and $Y_2$ are each independently selected from $N(R_2)$, S, and O, a1 and a2 are each independently 0 or 1, $L_1$ and $L_2$ are each independently $C(R_3)(R_4)$, b1 and b2 are each independently an integer from 0 to 20, the sum of a1, a2, b1, and b2 is 1 or more, c1 is an integer from 1 to 6, $R_1$ to $R_4$ are each independently selected from hydrogen, deuterium, —F, —Cl, —Br, —I, a hydroxyl group, a cyano group, a $C_1$-$C_{20}$ alkyl group, a $C_1$-$C_{20}$ alkoxy group, —NCO, —NCS, —OCN, —SCN, —C(=O)N(Q_1)_2, —Si(Q_1)(Q_2)(Q_3), —N(Q_1)(Q_2), —B(Q_1)(Q_2), —C(=O)(Q_1), —S(=O)_2(Q_1), and —P(=O)(Q_1)(Q_2), d1 is an integer from 0 to 9, and $Q_1$ to $Q_3$ are each independently selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

According to one or more embodiments, an ink composition includes the quantum dot and a solvent.

According to one or more embodiments, a light-emitting device includes a first electrode, a second electrode facing the first electrode, and an emission layer between the first electrode and the second electrode, wherein the emission layer includes the quantum dot.

According to one or more embodiments, an optical member includes the quantum dot.

According to one or more embodiments, an apparatus includes the quantum dot.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
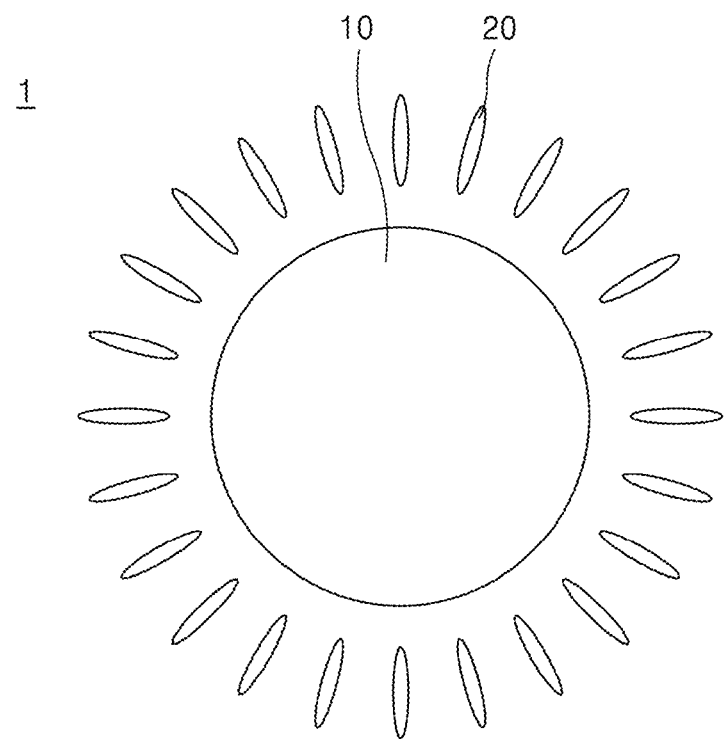
FIG. 1 is a schematic view of a structure of a quantum dot according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, throughout the disclosure, the expression "at least one of a, b and c" indicates only a, only b, only c, both a and b, both a and c, both b and c, all of a, b, and c, or variations thereof.

Further, the use of "may" when describing embodiments of the present disclosure refers to "one or more embodiments of the present disclosure".

As used herein, the terms "use," "using," and "used" may be considered synonymous with the terms "utilize," "utilizing," and "utilized," respectively.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Because the disclosure may have diverse modified embodiments, embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same (or substantially similar), or are in correspondence with each other, are rendered the same (or substantially similar) reference numeral regardless of the figure number, and redundant explanations are not provided.

It will be understood that although the terms "first," "second," etc. may be used herein to describe various components, these components should not be limited by these terms. These terms are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

In the following embodiments, when various components such as layers, films, regions, plates, etc. are said to be "on" another component, this may include not only a case in which other components are "immediately on" or "directly on" the layers, films, regions, or plates (e.g., without any intervening elements therebetween), but also a case in which other components may be placed therebetween. Sizes of elements in the drawings may be exaggerated for convenience of explanation. In other words, because sizes and thicknesses of components in the drawings are arbitrarily illustrated for convenience of explanation, the following embodiments are not limited thereto.

Quantum Dot

FIG. 1 is a schematic view of a structure of a quantum dot 1 according to one or more embodiments.

Referring to FIG. 1, the quantum dot 1 includes: a nanoparticle 10; and at least one ligand 20 represented by Formula 1 on a surface of the nanoparticle 10:

Formula 1

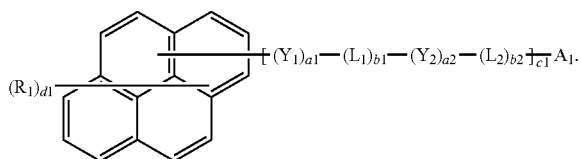

For example, the at least one ligand 20 may be in a form coordinated with the nanoparticle 10.

In Formula 1, $A_1$ may be a group including a thiol moiety, a bidentate thiol moiety, a dithio acid moiety, and/or a carboxylic acid moiety.

In one or more embodiments, $A_1$ may be an anchoring group binding to the surface of the nanoparticle 10. The term "anchoring group" as used herein refers to a binding group that allows each of the at least one ligand 20 to be adsorbed onto the nanoparticle 10 when coordinated with the nanoparticle 10.

For example, $A_1$ may be selected from groups represented by Formulae A-1 to A-4:

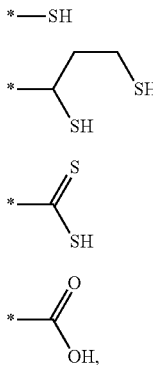

A-1
A-2
A-3
A-4 wherein * in the formulae above indicates a binding site to a neighboring atom.

In Formula 1, $Y_1$ and $Y_2$ may each independently be selected from $N(R_2)$, S, and O.

For example, $Y_1$ and $Y_2$ may each independently be $N(R_2)$ or S.

For example, $Y_1$ may be $N(R_2)$, and $Y_2$ may be S, but embodiments of the present disclosure are not limited thereto.

In Formula 1, a1 and a2 may each independently be 0 or 1.

In Formula 1, a1 and a2 indicate the number of $Y_1$ and the number of $Y_2$, respectively, wherein, when a1 is 0, *—$(Y_1)_{a1}$—*' may be a single bond, and when a2 is 0, *—$(Y_2)_{a2}$—*' may be a single bond.

For example, the sum of a1 and a2 may be 0 or 1.

In Formula 1, $L_1$ and $L_2$ may each independently be $C(R_3)(R_4)$.

In Formula 1, b1 and b2 may each independently be an integer from 0 to 20 (for example, 1 to 20).

In Formula 1, b1 and b2 indicate the number of $L_1$ and the number of $L_2$, respectively, wherein, when b1 is 2 or more, two or more of L1(s) may be identical to or different from each other, when b2 is 2 or more, two or more of $L_2$(s) may be identical to or different from each other, when b1 is 0, *—$(L_1)_{b1}$—*' may be a single bond, and when b2 is 0, *—$(L_2)_{b2}$—*' may be a single bond.

In Formula 1, the sum of a1, a2, b1, and b2 may be 1 or more.

In one or more embodiments, the sum of b1 and b2 may be 1 or more.

For example, the sum of b1 and b2 may be 2 or more.

In one or more embodiments, *—$(Y_1)_{a1}$-$(L_1)_{b1}$-$(Y_2)_{a2}$-$(L_2)_{b2}$-*' may be selected from groups represented by Formulae L-1 to L-10:

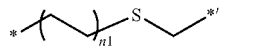 L-1
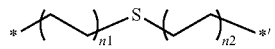 L-2
L-3
L-4
L-5
L-6
L-7
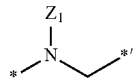 L-8
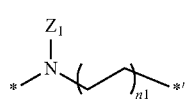 L-9
 L-10 wherein, in Formulae L-1 to L-10,
n1 and n2 may each independently be an integer from 1 to 20,
$Z_1$ may be selected from hydrogen, deuterium, —F, —Cl, —Br, —I, a hydroxyl group, a cyano group, a $C_1$-$C_{20}$ alkyl group, and a $C_1$-$C_{20}$ alkoxy group, and
* and *' each indicate a binding site to a neighboring atom.

In Formula 1, c1 may be an integer from 1 to 6.

In Formula 1, c1 indicates the number of the group represented by *—$(Y_1)_{a1}$-$(L_1)_{b1}$-$(Y_2)_{a2}$-$(L_2)_{b2}$-*', wherein, when c1 is 2 or more, two or more of the groups represented by *—$(Y_1)_{a1}$-$(L_1)_{b1}$-$(Y_2)_{a2}$-$(L_2)_{b2}$-*' may be identical to or different from each other.

In Formula 1, $R_1$ to $R_4$ may each independently be selected from hydrogen, deuterium, —F, —Cl, —Br, —I, a hydroxyl group, a cyano group, a $C_1$-$C_{20}$ alkyl group, a $C_1$-$C_{20}$ alkoxy group, —NCO, —NCS, —OCN, —SCN, —C(=O)N(Q_1)_2, —Si(Q_1)(Q_2)(Q_3), —N(Q_1)(Q_2), —B(Q_1)(Q_2), —C(=O)(Q_1), —S(=O)_2(Q_1), and —P(=O)(Q_1)(Q_2), wherein $Q_1$ to $Q_3$ may each independently be selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

In one or more embodiments, $R_1$ to $R_4$ may each independently be selected from hydrogen, deuterium, —F, —Cl, —Br, —I, a hydroxyl group, a cyano group, a $C_1$-$C_{20}$ alkyl group, and a $C_1$-$C_{20}$ alkoxy group.

In Formula 1, d1 may be an integer from 0 to 9.

In Formula 1, d1 indicates the number of $R_1$, wherein, when d1 is 2 or more, two or more of $R_1$(s) may be identical to or different from each other.

In one or more embodiments, the ligand 20 may be selected from compounds represented by Formulae 1-1 and 1-2:

Formula 1-1

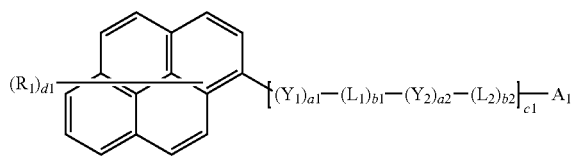

Formula 1-2

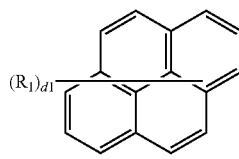

wherein, in Formulae 1-1 and 1-2, $A_1$, $Y_1$, $Y_2$, a1, a2, $L_1$, $L_2$, b1, b2, $R_1$ to $R_4$, c1, and d1 may each be the same as described herein.

For example, the ligand 20 may be at least one selected from Ligands 1 to 10:

1
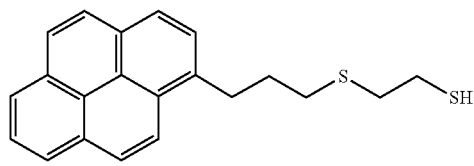

2
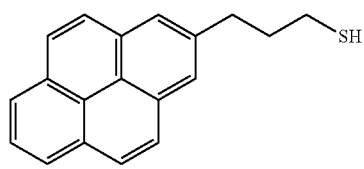

3
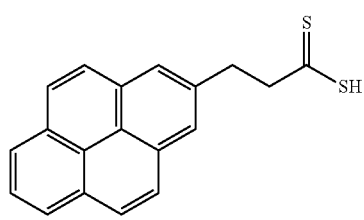

4
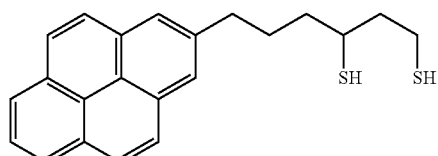

5
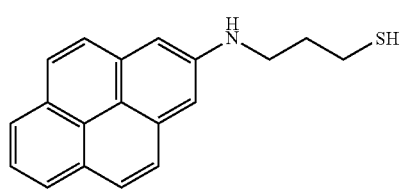

6
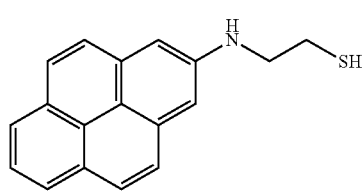

7
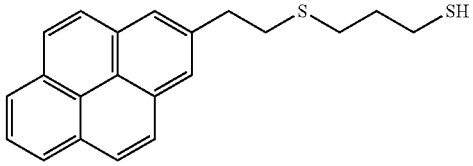

8
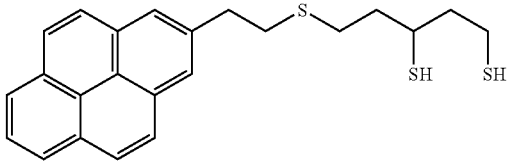

9
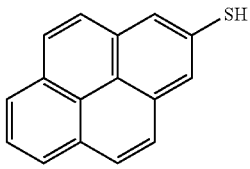

10
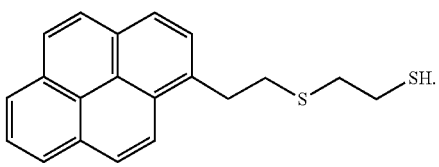

The quantum dot 1 has a structure in which the ligand 20 represented by Formula 1 is on the surface of the nanoparticle 10, thereby exhibiting an effect of easy (or suitable) injection of holes and electrons.

The ligand 20 includes an anchoring group including a thiol moiety, a bidentate thiol moiety, a dithio acid moiety, and/or a carboxylic acid moiety, thereby exhibiting an effect of easy (or suitable) arrangement on (e.g., attachment to) the surface of the nanoparticle 10.

In one or more embodiments, the ligand 20 may include a pyrene moiety, and in this regard, the ligand 20 may have a narrow energy band gap (about 3.75 eV). Accordingly, when the quantum dot 1 is introduced into an emission layer of a light-emitting device, highest occupied molecular orbital (HOMO) energy level differences or lowest unoccupied molecular orbital (LUMO) energy level differences between a hole transport region and an electron transport region that are adjacent to the emission layer may be reduced, thereby exhibiting an effect of easy (or suitable) injection of holes and electrons to the emission layer.

In one or more embodiments, the ligand 20 includes a linker between the pyrene moiety and the anchoring group, thereby reducing a steric effect between the ligands 20 introduced to the surface of the quantum dot 1.

In one or more embodiments, the ligand 20 may increase colloidal stability of the quantum dot 1 by introducing the linker as a hydrocarbon group or a certain heteroatom. In this regard, due to the influence of dipole moment on the surface of the quantum dot 1, the ligand 20 may exhibit an effect of adjusting energy band position.

Furthermore, in the quantum dot 1, the ligand 20 is on the surface of nanoparticle 10, so that, compared to a case where a ligand is simply mixed with a nanoparticle, the light-emitting device of the present embodiments may exhibit an effect of improving efficiency by shortening the length of the ligand 20 on the surface of the quantum dot 1 and by reducing a non-conductive organic material.

The nanoparticle 10 may be a spherical semiconductor nanomaterial having a size of several to hundreds nanometers (nm), and may include a core including (e.g., consisting of) a material having a small band gap and a shell arranged to surround the core.

In one or more embodiments, the nanoparticle 10 may have a core-shell structure including a core including a first semiconductor (e.g., a first semiconductor crystal or a first crystal structure) and a shell including a second semiconductor (e.g., a second semiconductor crystal or a second crystal structure differing from the first crystal structure), or the nanoparticle 10 may be a perovskite compound.

For example, the first semiconductor and the second semiconductor may each independently include a Group 12-16 compound, a Group 13-15 compound, a Group 14-16 compound, a Group 14 element and compound, a Group 11-13-16 compound, a Group 11-12-13-16 compound, or any combination thereof.

For example, the first semiconductor and the second semiconductor may each independently be selected from: CdS, CdSe, CdTe, ZnS, ZnSe, ZnTe, ZnO, HgS, HgSe, HgTe, MgS, MgSe; CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe; CdZnSeS, CdZnSeTe, CdZnSTe, CdHgSeS, CdHgSeTe, CdHgSTe, HgZnSeS, HgZnSeTe, and HgZnSTe;

GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InZnP; GaIlNP, GaIlNAs, GaIlNSb, GaIlPAs, GaIlPSb, GaInNP, GaInNAs, GaInNSb, GaInPAs, GaInPSb, InAlNP, InAlNAs, InAlNSb, InAlPAs, and InAlPSb;

SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, and SnPbSTe;

Si, Ge, SiC, and SiGe;

AgInS, AgInS$_2$, CuInS, CuInS$_2$, CuGaO$_2$, AgGaO$_2$, and AgAlO$_2$; and any combination thereof.

For example, the first semiconductor may be selected from GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InZnP, GaIlNP, GaIlNAs, GaIlNSb, GaIlPAs, GaIlPSb, GaInNP, GaInNAs, GaInNSb, GaInPAs, GaInPSb, InAlNP, InAlNAs, InAlNSb, InAlPAs, InAlPSb, and any combination thereof; and the second semiconductor may be selected from CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, and any combination thereof.

In one or more embodiments, the perovskite compound is a material having a three-dimensional crystal structure associated with the crystal structure of CaTiO$_3$.

For example, the perovskite compound may be represented by Formula 4: Formula 4

$$[A][B_m][X]_3,$$

wherein, in Formula 4,

A may be at least one monovalent organic-cation, at least one monovalent inorganic-cation, or any combination thereof, B may be at least one divalent inorganic-cation, m is a real number satisfying the condition of 0<m≤1, and X may be at least one monovalent anion.

An average particle size (D50) of the nanoparticle 10 may be in a range of about 2 nm to about 10 nm.

As used herein, unless otherwise defined, the average particle size (D50) refers to a diameter of particles having a cumulative volume of 50% by volume in the particle size distribution. The average particle size (D50) may be measured by a suitable technique, e.g., using a particle size analyzer, transmission electron microscope photography, and/or scanning electron microscope photography. Another method may be performed by using a measuring device with dynamic light scattering, analyzing data to count a number of particles relative to each particle size, and then calculating to obtain an average particle size (D50).

A D50 of the quantum dot 1 may be in a range of about 3 nm to about 15 nm, for example, about 4 nm to about 15 nm, about 5 nm to about 12 nm, or about 8 nm to about 10 nm. When the D50 of the quantum dot 1 is within the ranges above, the quantum dot 1 may have an excellent (or improved or suitable) dispersion degree while having a relatively large amount of nanoparticle 10.

Ink Composition

Another aspect of the present disclosure provides an ink composition including the quantum dot and a solvent.

In the ink composition, an amount of the quantum dot may be, based on the total weight of the ink composition, equal to or greater than about 0.1 wt % and equal to or less than about 20 wt %, or equal to or greater than about 0.2 wt % and equal to or less than about 10 wt %, but embodiments of the present disclosure are not limited thereto. When the amount of the quantum dot is within the ranges above, the ink composition may be suitable for use in manufacturing a light-emitting device having sufficient (or suitable) luminescence efficiency by a soluble process.

A light-emitting device including an emission layer including the quantum dots of the present embodiments may be able to provide improved film uniformity, improved charge injection balance, improved effect of quantum dot efficiency by a transport layer, and/or sufficiently improved luminescence efficiency and/or lifespan by blocking (or reducing) direct contact between an electron transport layer and a hole transport layer due to a gap of the quantum dots.

For use as the solvent, the type (or kind) of the solvent is not limited as long as it is capable of properly (or suitably) dispersing the quantum dots.

For example, the solvent may be an organic solvent.

In one or more embodiments, the solvent may be selected from a chlorine-based material, an ether-based material, an ester-based material, a ketone-based material, an aliphatic hydrocarbon-based material, and an aromatic hydrocarbon-based material, but embodiments of the present disclosure are not limited thereto.

In one or more embodiments, the solvent may be dichloromethane, 1,2-dichloroethane, 1,1,2-trichloroethane, chlorobenzene, or o-dichlorobenzene; tetrahydrofuran, dioxane, anisole, 4-methylanisole, or butyl phenyl ether; toluene, xylene, mesitylene, ethylbenzene, n-hexylbenzene, cyclohexylbenzene, trimethylbenzene, or tetrahydronaphthalene; cyclohexane, methylcyclohexane, n-pentane, n-hexane, n-heptane, n-octane, n-nonane, n-decane, dodecane, hexadecane, or oxadecane; acetone, methylethylketone, cyclohexanone, acetophenone; ethyl acetate, butyl acetate, methyl cellosolve acetate, ethyl cellosolve acetate, methyl benzoate, ethyl benzoate, butyl benzoate, and/or 3-phenoxy benzoate, or any combination thereof.

In the ink composition, an amount of the solvent may be, based on the total weight of the ink composition, equal to or greater than about 80 wt % and equal to or less than about 99.9 wt %, or equal to or greater than about 90 wt % and equal to or less than about 99.8 wt %, but embodiments of the present disclosure are not limited thereto. When the amount of the solvent is within the ranges above, the quantum dots may be properly (or suitably) dispersed in the ink composition and have a solid concentration suitable for a soluble process.

The ink composition may further include a hole transport compound or an electron transport compound.

The hole transport compound may be the same as that which is described in connection with a compound included in a hole transport region, to be described below.

The electron transport compound may be the same as that which is described in connection with a compound included in an electron transport region, to be described below.

In the ink composition, an amount of the hole transport compound or the electron transport compound may be, based on the total weight of the ink composition, equal to or greater than about 0.5 wt % and equal to or less than about 20 wt %, for example, equal to or greater than about 0.5 wt % and equal to or less than about 15 wt %, but embodiments of the present disclosure are not limited thereto.

The ink composition may have viscosity in a range of about 1 centipoise (cP) to about 10 cP. The ink composition satisfying the viscosity range above may be suitable for manufacturing an emission layer including the quantum dots of a light-emitting device.

The ink composition may have surface tension in a range of about 10 dynes/cm to about 40 dynes/cm. The ink composition satisfying the surface tension range above may be suitable for manufacturing an emission layer including the quantum dots of a light-emitting device.

Light-Emitting Device

Figure 2:
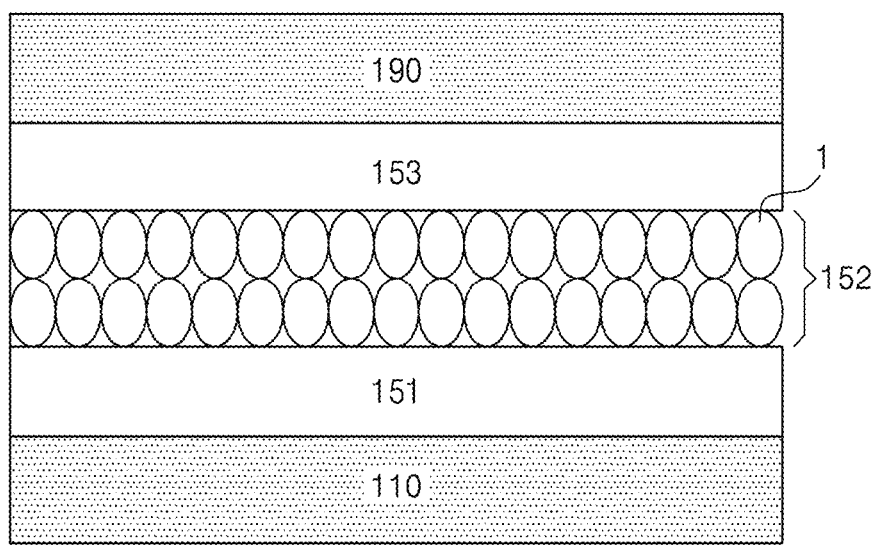
FIG. 2 is a schematic view of a light-emitting device according to one or more embodiments.

FIG. 2 is a schematic cross-sectional view of a light-emitting device 100 according to one or more embodiments.

Hereinafter, a structure of the light-emitting device 100 according to one or more embodiments and a method of manufacturing the light-emitting device 100 will be described in connection with FIG. 2.

Referring to FIG. 2, the light-emitting device 100 according to one or more embodiments includes: a first electrode 110, a second electrode 190 facing the first electrode 110; and an emission layer 152 arranged between the first electrode 110 and the second electrode 190, wherein the emission layer 152 includes the quantum dots 1.

The quantum dots 1 may be the same as described herein.

For example, the light-emitting device 100 may further include at least one of a hole transport region 151 between the first electrode 110 and the emission layer 152, and an electron transport region 153 between the emission layer 152 and the second electrode 190.

First Electrode

The first electrode 110 may be formed by depositing or sputtering a material to form the first electrode 110 on the substrate. When the first electrode 110 is an anode, the material to form the first electrode 110 may be selected from materials having a high work function to facilitate hole injection.

In FIG. 2, a substrate may be additionally arranged under the first electrode 110 or above the second electrode 190. The substrate may be a glass substrate, and/or a plastic substrate, each having excellent (or suitable) mechanical strength, thermal stability, transparency, surface smoothness, ease of handling, and/or water resistance.

The first electrode 110 may be a reflective electrode, a semi-transmissive electrode, or a transmissive electrode. In one or more embodiments, when the first electrode 110 is a transmissive electrode, the material to form the first electrode 110 may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, the material to form the first electrode 110 may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

Hole Transport Region

The hole transport region 151 may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The hole transport region 151 may include at least one layer selected from a hole injection layer, a hole transport layer, an emission auxiliary layer, and an electron blocking layer.

For example, the hole transport region 151 may have a single-layered structure including (e.g., consisting of) a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein layers in each structure are sequentially stacked on the first electrode 110, but embodiments of the present disclosure are not limited thereto.

The hole transport region 151 may include at least one selected from m-MTDATA, TDATA, 2-TNATA, NPB (NPD), p-NPB, TPD, Spiro-TPD, Spiro-NPB, methylated NPB, TAPC, HMTPD, 4,4',4''-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

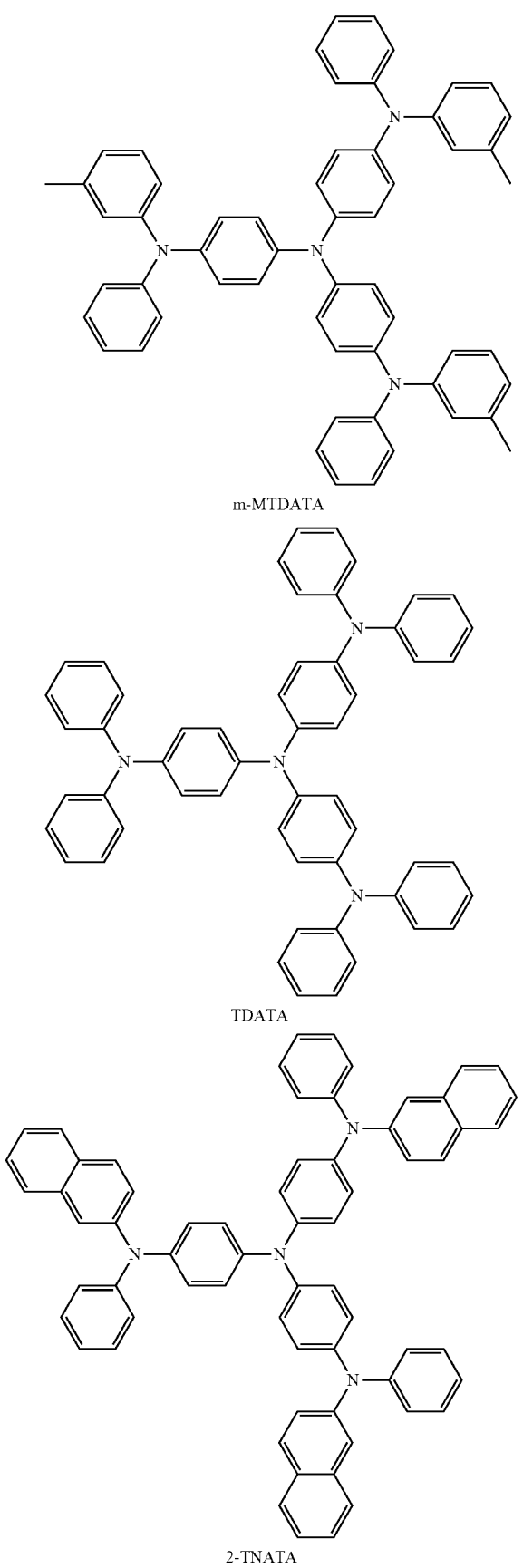
m-MTDATA
TDATA
2-TNATA
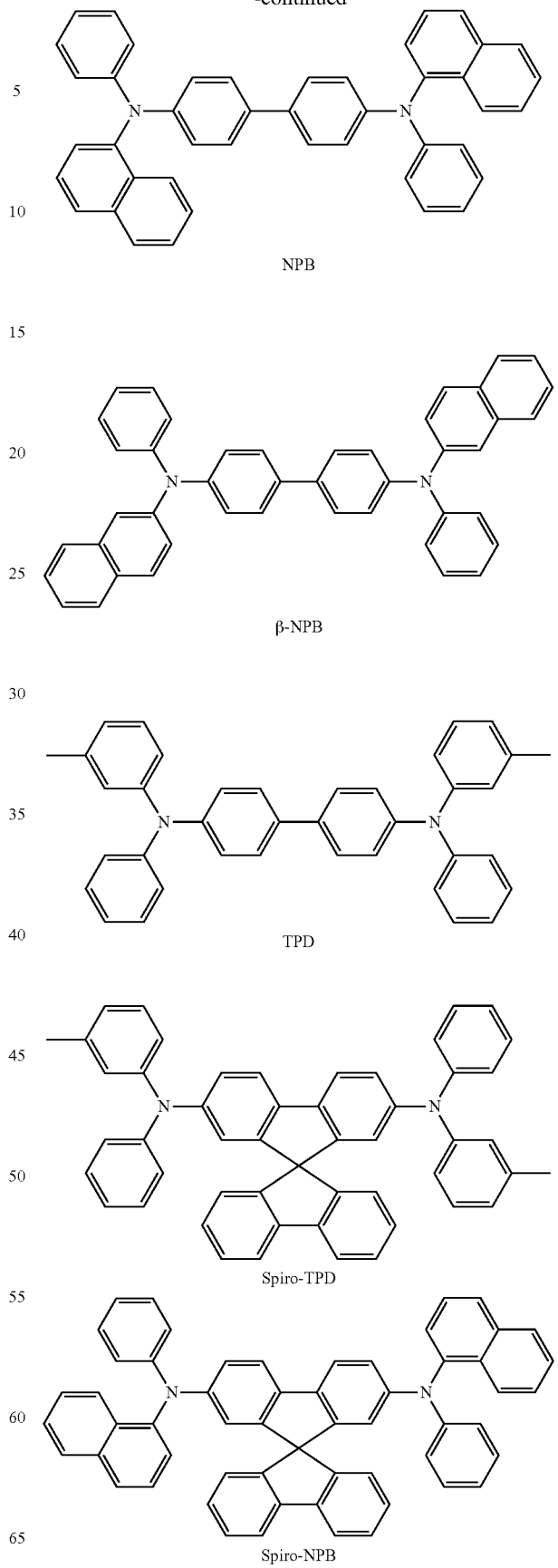
NPB
β-NPB
TPD
Spiro-TPD
Spiro-NPB

-continued

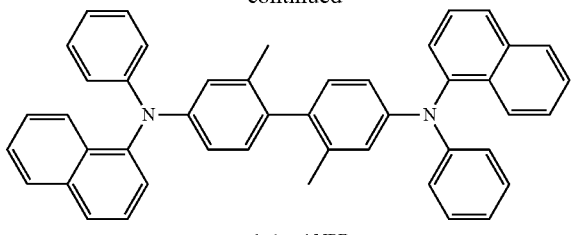

methylated NPB

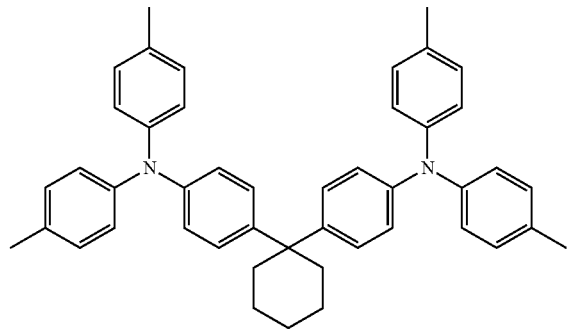

TAPC

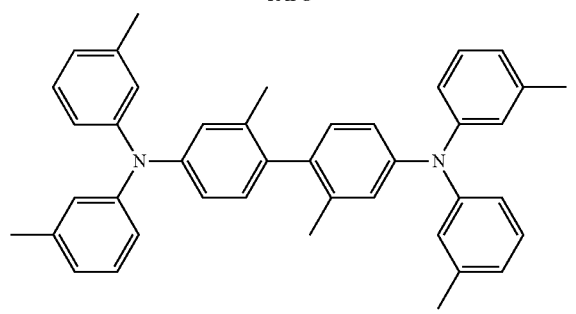

HMTPD

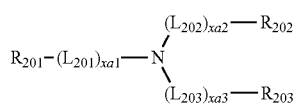

Formula 201

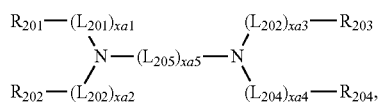

Formula 202 wherein, in Formulae 201 and 202, $L_{201}$ to $L_{204}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and $R_{201}$ to $R_{204}$ and $Q_{201}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, and/or a diphenyl-methylene group, and $R_{203}$ and $R_{204}$ may optionally be linked to each other via a single bond, a dimethyl-methylene group, and/or a diphenyl-methylene group.

In one or more embodiments, in Formulae 201 and 202, $L_{201}$ to $L_{205}$ may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazone group, a $C_1$-$C_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a C$_1$-C$_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si(Q$_{31}$)(Q$_{32}$)(Q$_{33}$), and —N(Q$_{31}$)(Q$_{32}$), wherein Q$_{31}$ to Q$_{33}$ may each independently be selected from a C$_1$-C$_{10}$ alkyl group, a C$_1$-C$_{10}$ alkoxy group, a phenyl group, a biphenyl group, a terphenyl group, and a naphthyl group.

In one or more embodiments, xa1 to xa4 may each independently be 0, 1, or 2.

In one or more embodiments, xa5 may be 1, 2, 3, or 4.

In one or more embodiments, R$_{201}$ to R$_{204}$ and Q$_{201}$ may each independently be selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazone group, a C$_1$-C$_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a C$_1$-C$_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si(Q$_{31}$)(Q$_{32}$)(Q$_{33}$), and —N(Q$_{31}$)(Q$_{32}$), wherein Q$_{31}$ to Q$_{33}$ may each be the same as described above.

In one or more embodiments, in Formula 201, at least one selected from R$_{201}$ to R$_{203}$ may each independently be selected from:

a fluorenyl group, a spiro-bifluorenyl group, a carbazolyl group, a dibenzofuranyl group, and a dibenzothiophenyl group; and a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazone group, a C$_1$-C$_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a C$_1$-C$_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, in Formula 202, i) R$_{201}$ and R$_{202}$ may be linked to each other via a single bond, and/or ii) R$_{203}$ and R$_{204}$ may be linked to each other via a single bond.

In one or more embodiments, at least one of R$_{201}$ to R$_{204}$ in Formula 202 may be selected from:

a carbazolyl group; and a carbazolyl group substituted with at least one selected from deuterium, —F, —Cl, —Br, —I, a hydroxyl group, a cyano group, a nitro group, an amidino group, a hydrazino group, a hydrazone group, a C$_1$-C$_{20}$ alkyl group, a C$_1$-C$_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a C$_1$-C$_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but embodiments of the present disclosure are not limited thereto.

In one or more embodiments, the compound represented by Formula 201 may be represented by Formula 201A:

Formula 201A

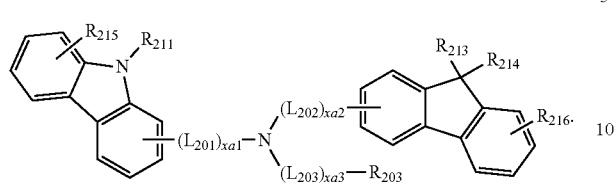

In one or more embodiments, the compound represented by Formula 201 may be represented by Formula 201A(1), but embodiments of the present disclosure are not limited thereto:

Formula 201A(1)

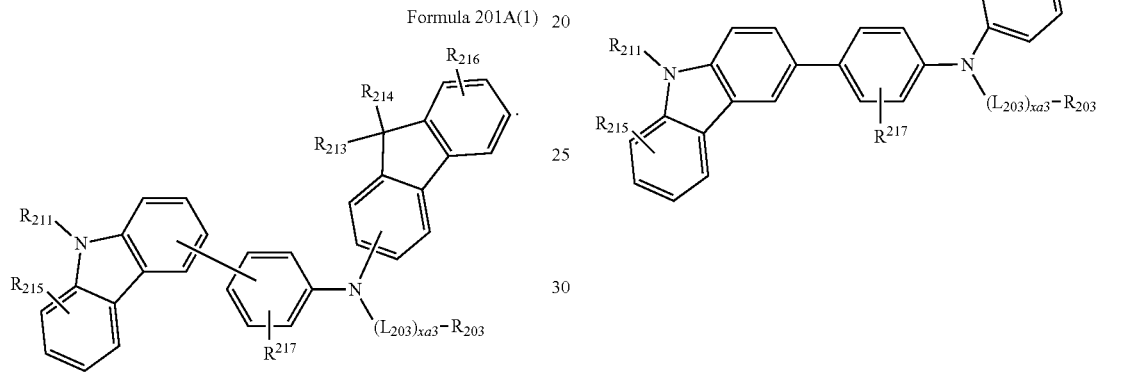

In one or more embodiments, the compound represented by Formula 201 may be represented by Formula 201A-1, but embodiments of the present disclosure are not limited thereto:

Formula 201A-1

In one or more embodiments, the compound represented by Formula 202 may be represented by Formula 202A:

Formula 202A

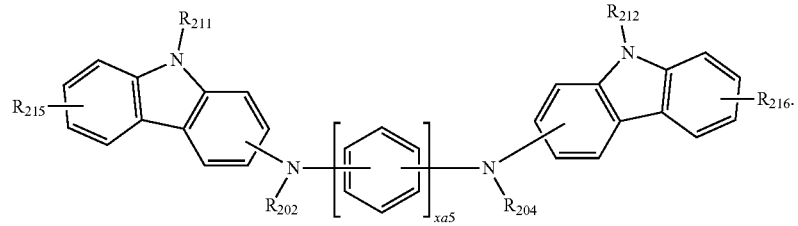

In one or more embodiments, the compound represented by Formula 202 may be represented by Formula 202A-1:

Formula 202A-1

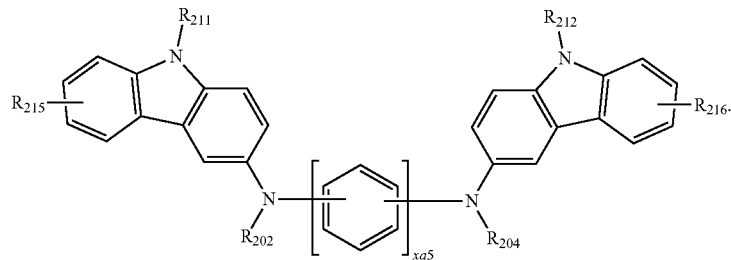

In Formulae 201A, 201A(1), 201A-1, 202A, and 202A-1, $L_{201}$ to $L_{203}$, xa1 to xa3, xa5, and $R_{202}$ to $R_{204}$ may each be the same as described above, $R_{211}$ and $R_{212}$ may each be the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region 151 may include at least one compound selected from Compounds HT1 to HT39, but embodiments of the present disclosure are not limited thereto:

HT1

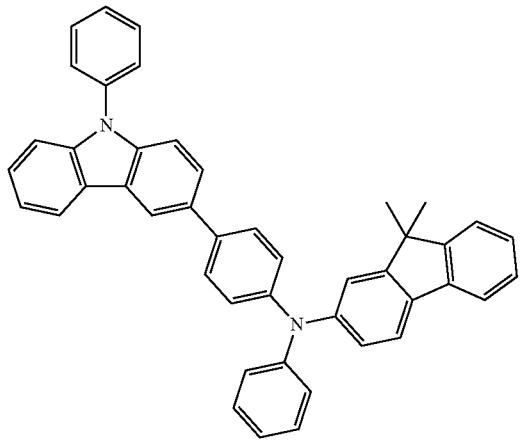

HT2

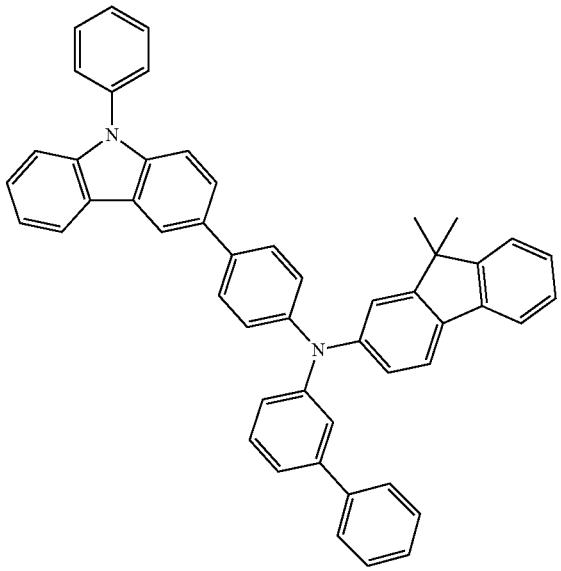

HT3

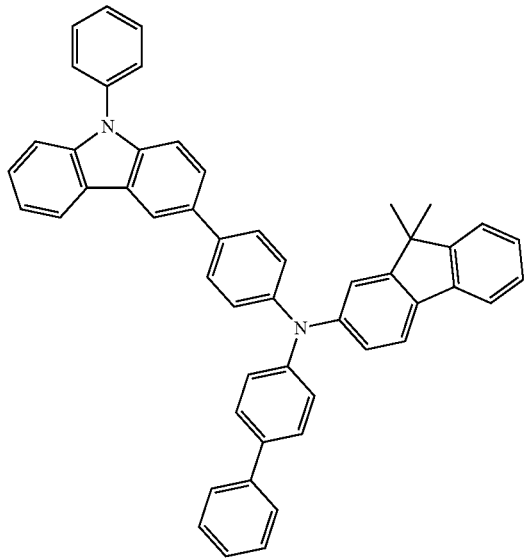

HT4

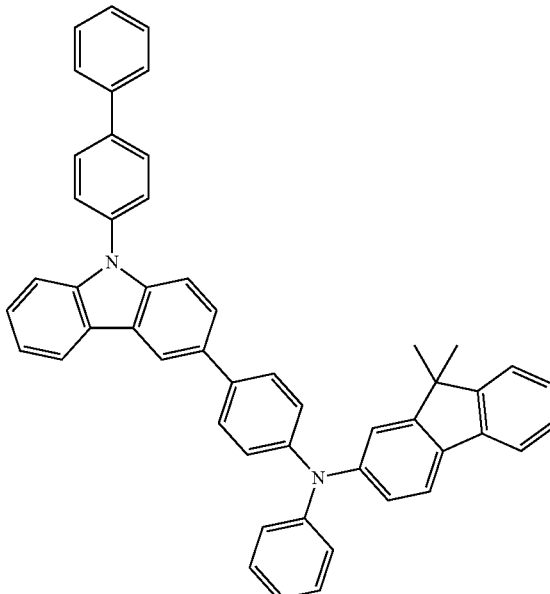

-continued
HT5
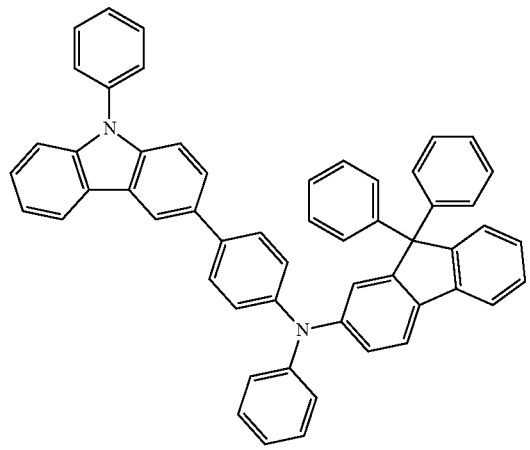
HT6
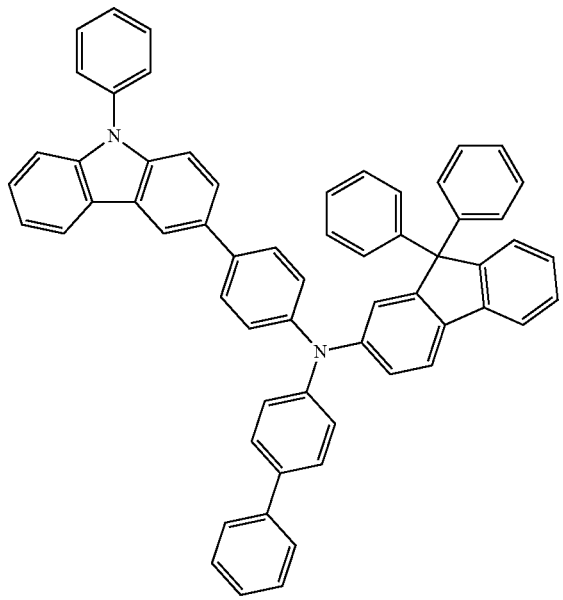
HT7
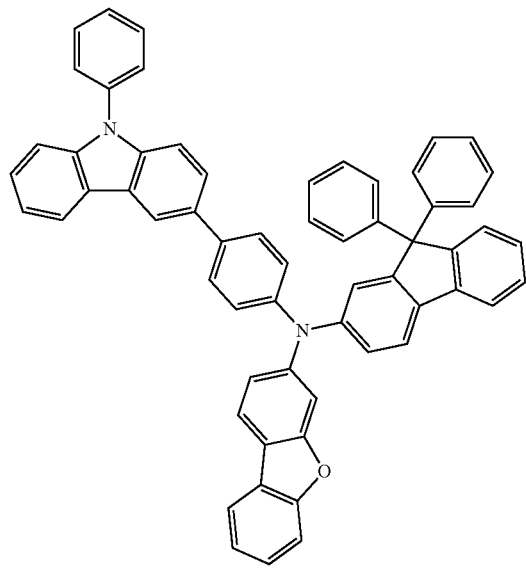
HT8
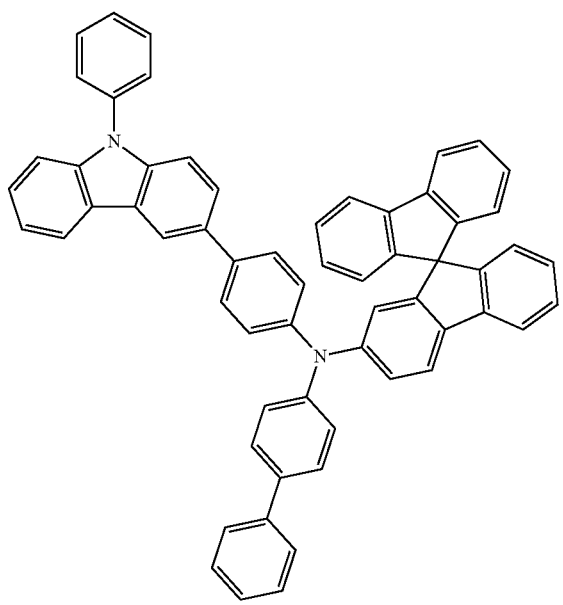

-continued
HT9
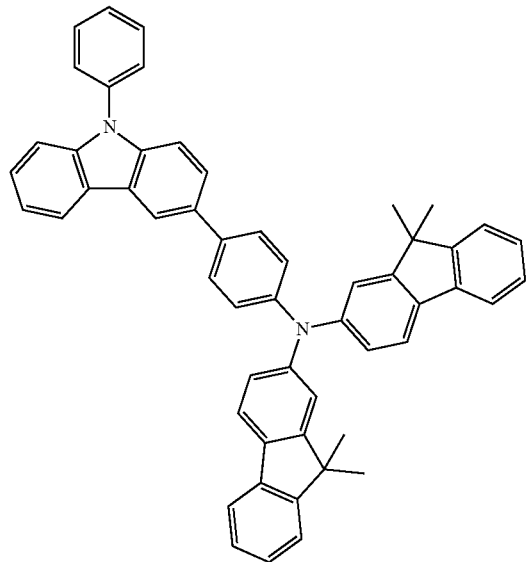
HT10
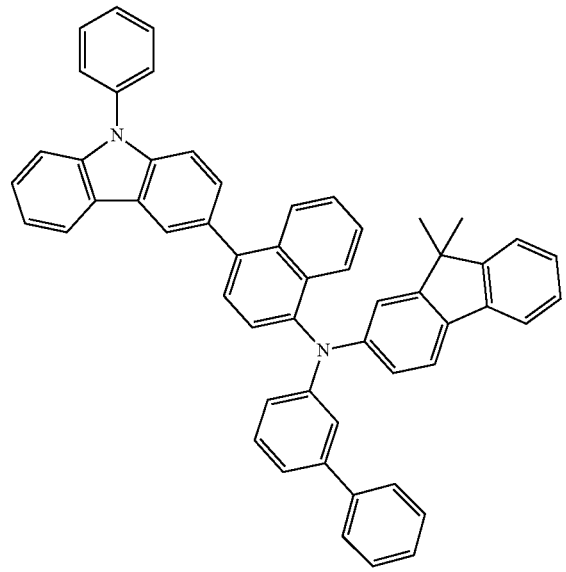
HT11
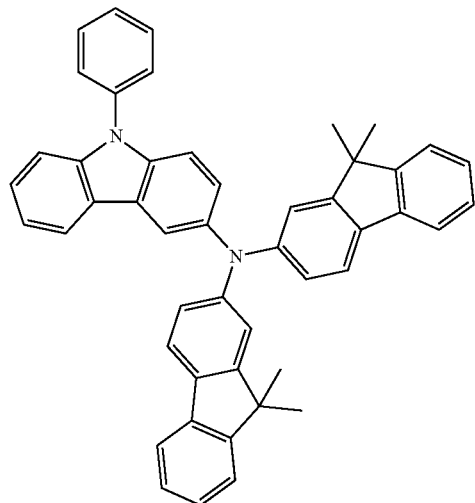
HT12
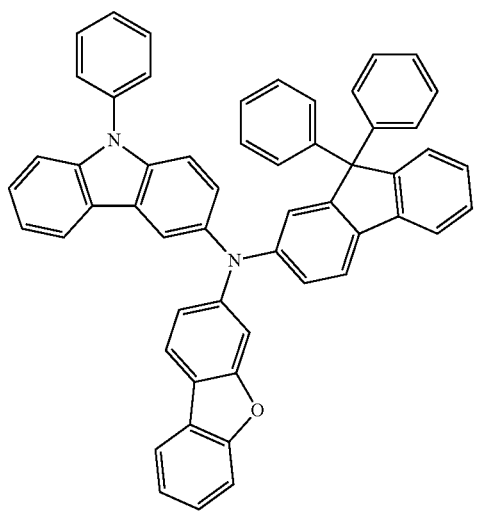

-continued
HT13
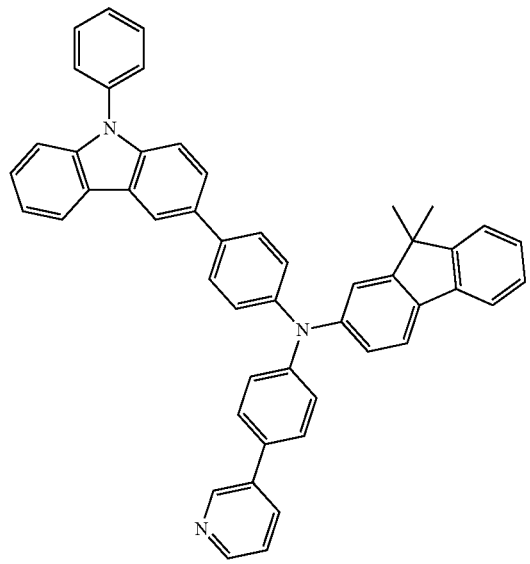
HT14
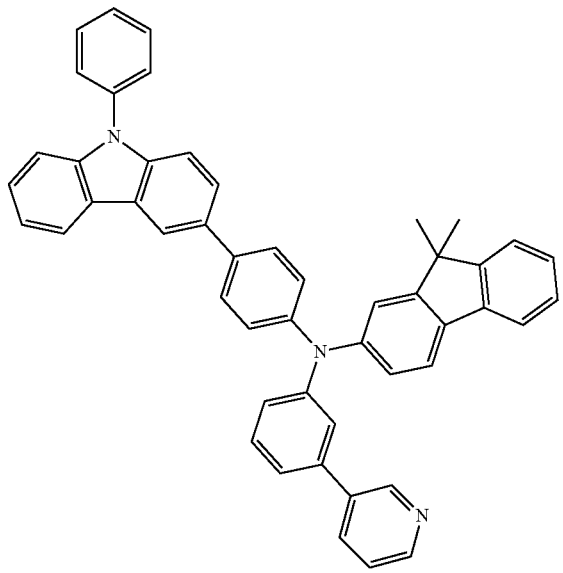
HT15
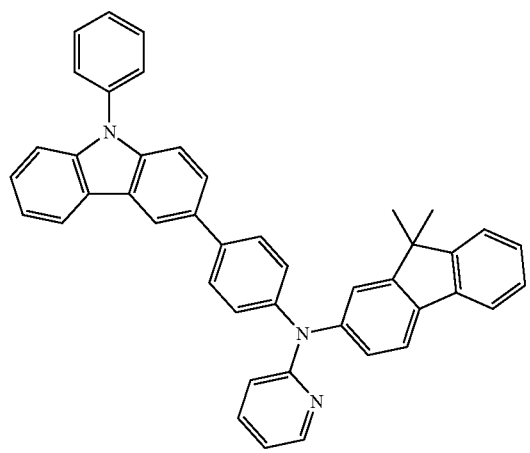
HT16
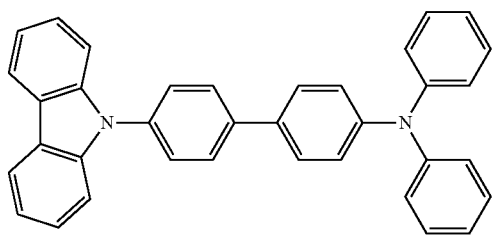
HT17
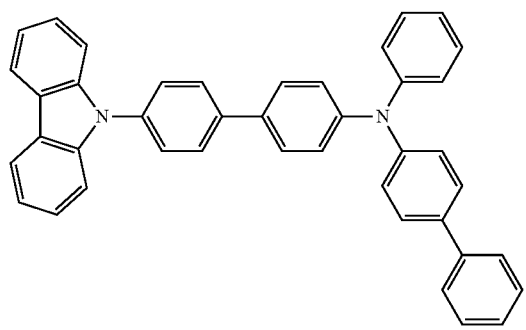
HT18
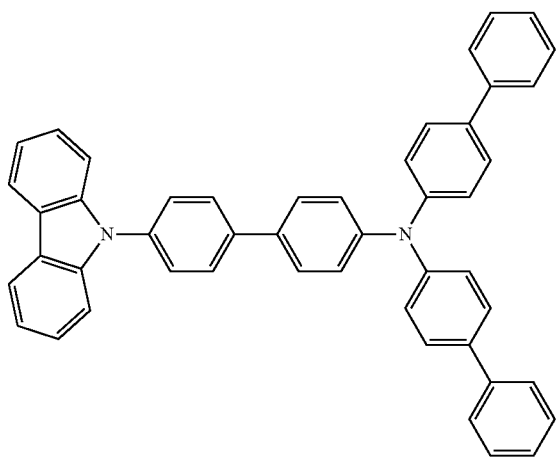

-continued
HT19
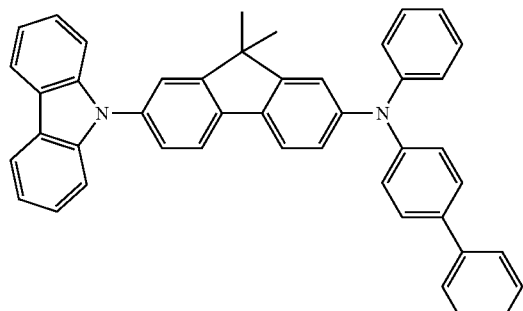
HT20
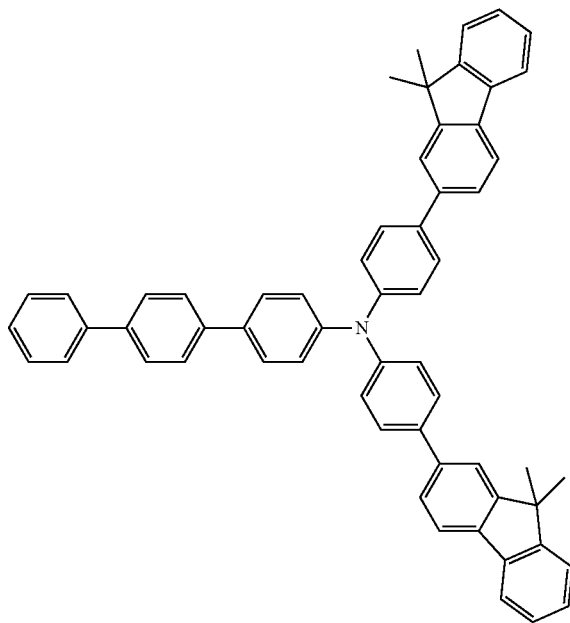
HT21
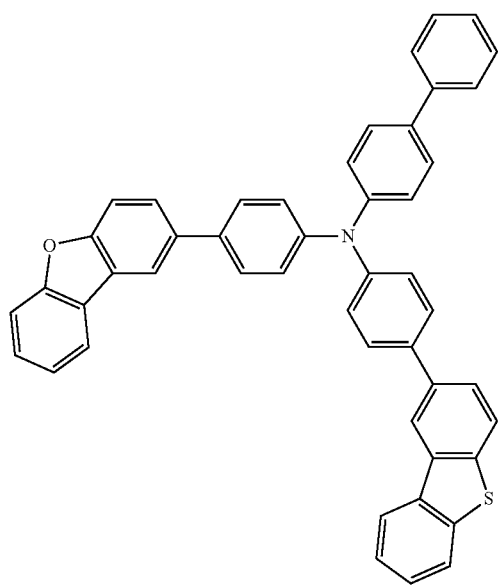
HT22
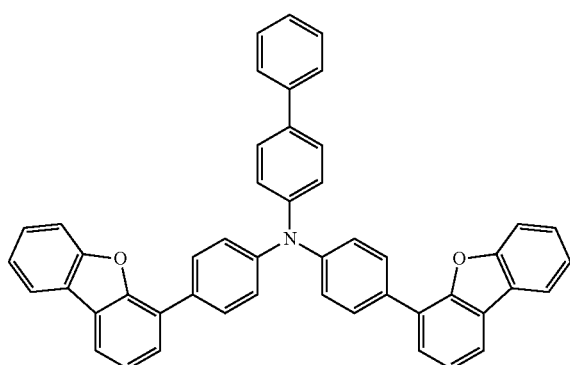

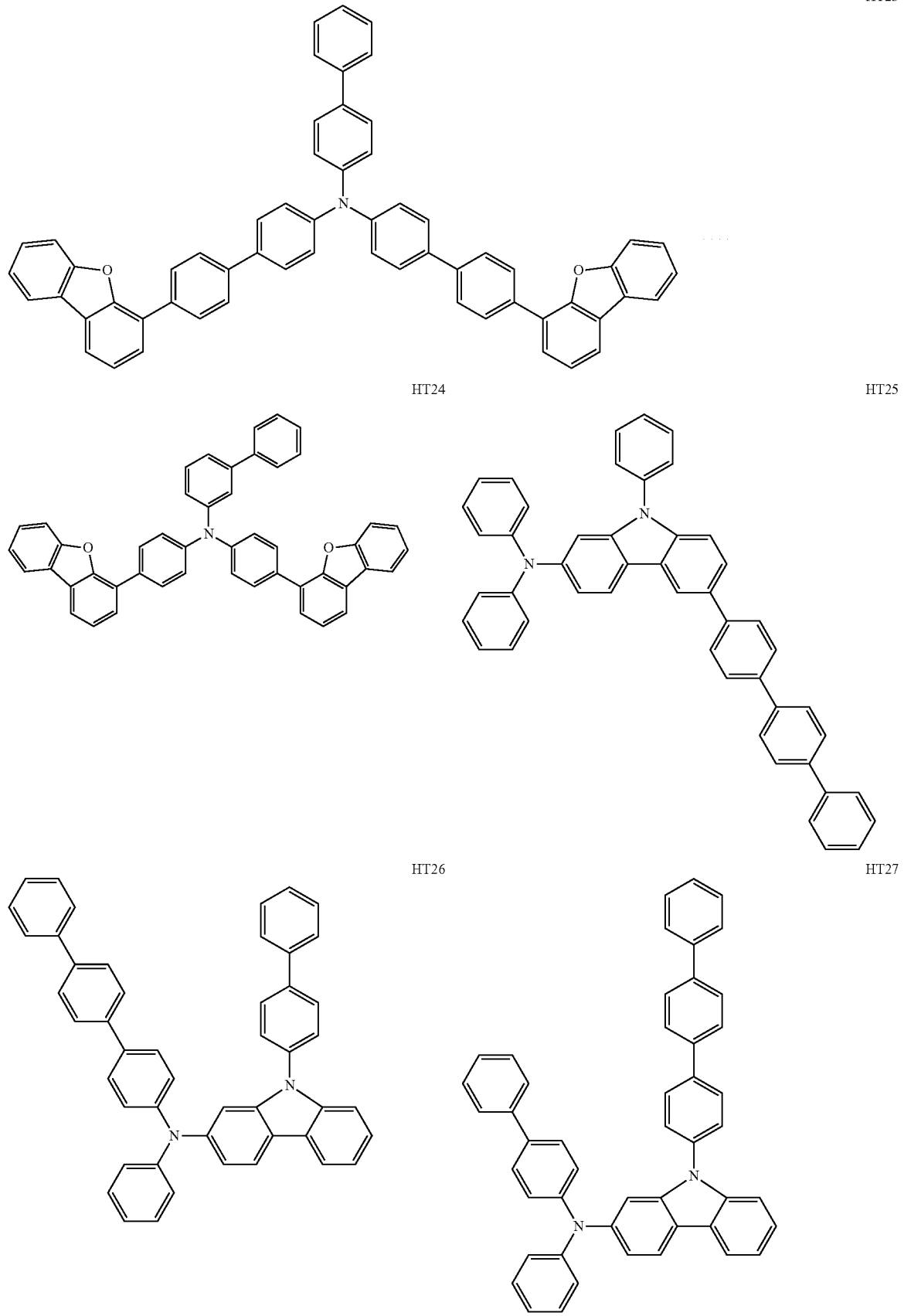

-continued
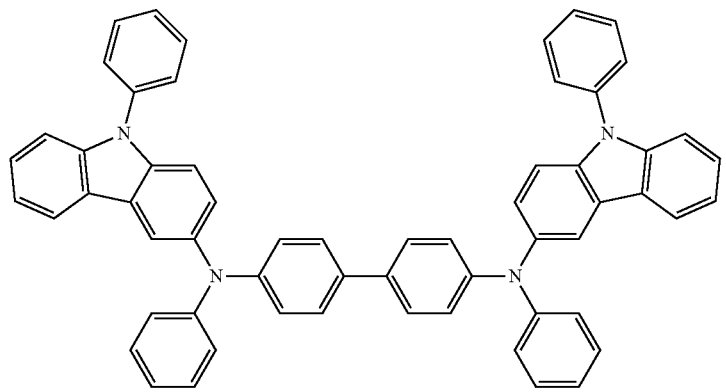
HT28
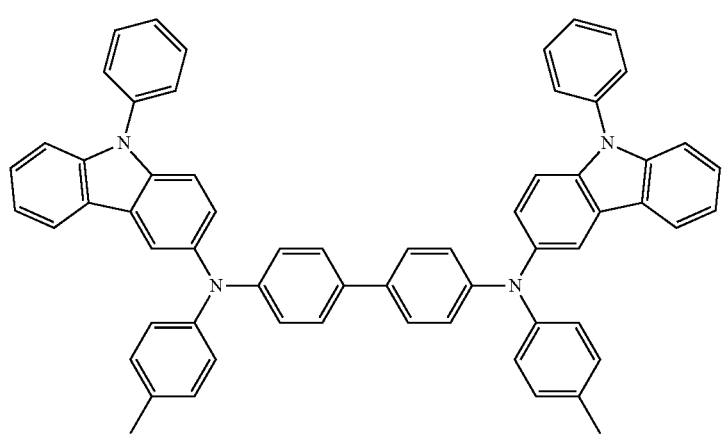
HT29
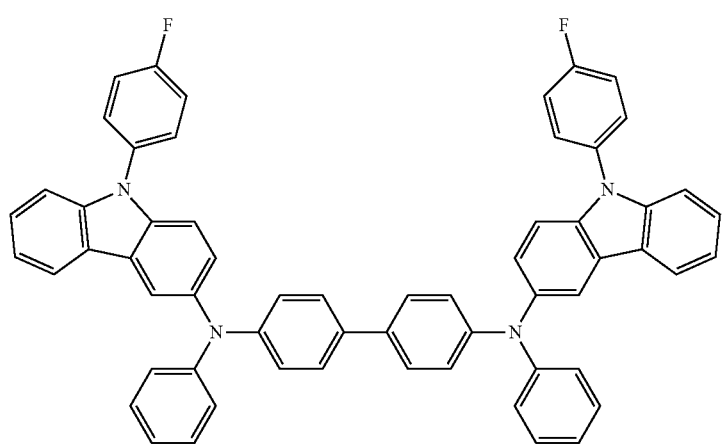
HT30

-continued
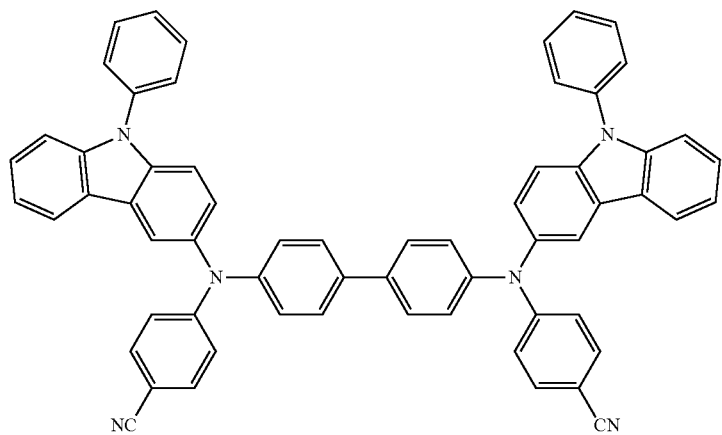
HT31
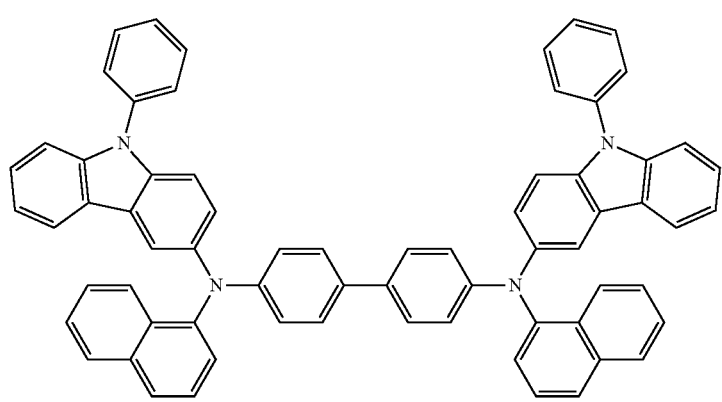
HT32
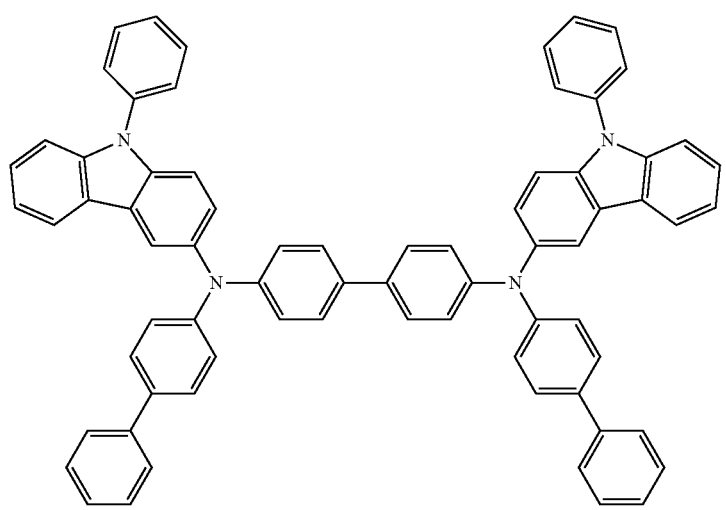
HT33

-continued
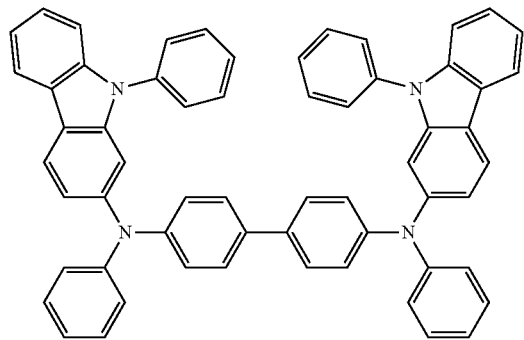
HT34
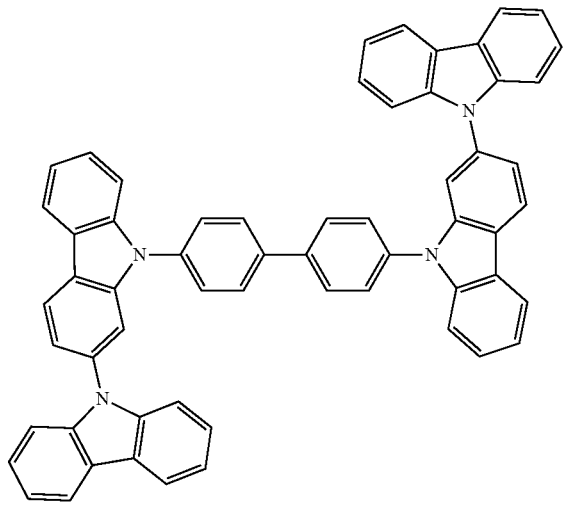
HT35
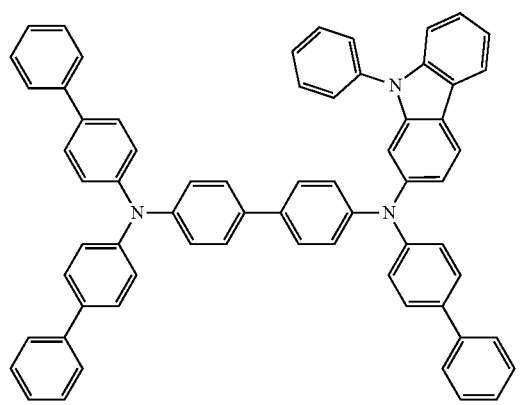
HT36
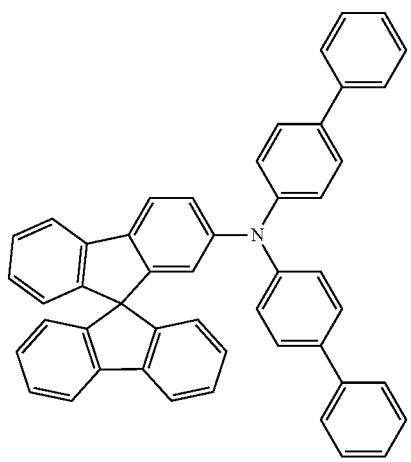
HT37
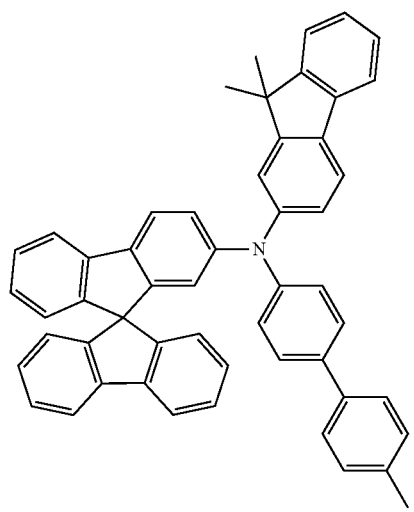
HT38
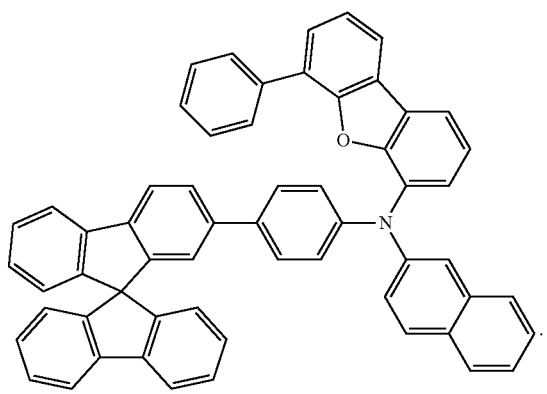
HT39

For example, the hole transport region 151 may include metal oxide.

A thickness of the hole transport region 151 may be in a range of about 100 angstroms (Å) to about 10,000 Å, for example, about 100 Å to about 1,000 Å. When the thickness of the hole transport region 151 is within these ranges, satisfactory (or suitable) hole transportation characteristics may be obtained without a substantial increase in driving voltage.

The emission auxiliary layer may increase light-emission efficiency by compensating for an optical resonance distance according to the wavelength of light emitted by the emission layer 152, and the electron blocking layer may block or reduce the flow of electrons from the electron transport region 153. The emission auxiliary layer and the electron blocking layer may each independently include any of the materials as described above.

Emission Layer

In one or more embodiments, the emission layer 152 may have a single-layered structure or a structure in which two or more layers are stacked. In one or more embodiments, the emission layer 152 may have a single-layered structure or a structure in which two to ten layers are stacked.

The emission layer 152 may include at least one quantum dot 1 (hereinafter, also referred to as "quantum dots").

The quantum dots may be dispersed in a naturally coordinated form in a dispersion medium, such as an organic solvent. Here, for use as the dispersion medium, any suitable transparent medium that does not substantially affect the wavelength conversion performance of the quantum dots, does not substantially change with light, or reflect light, and does not cause absorption of light may be utilized. For example, the organic solvent may include at least one selected from toluene, chloroform, and ethanol.

Unlike a bulky material, the quantum dots may have discontinuous band gap energy due to the quantum confinement effect. In one or more embodiments, the distance between energy bands of the quantum dots may vary according to the size of the quantum dots, and even when the same quantum dots are used, light having different wavelengths may be emitted by changing the size of the quantum dots. Smaller quantum dots have greater band gap energy, so that light having a shorter wavelength may be emitted. In view of such characteristics, the size of the quantum dots may be adjusted by appropriately changing the growth condition of the nanocrystals, so as to obtain light of the desired wavelength range. Therefore, by introducing the quantum dots into the light-emitting device, the light-emitting device may be able to exhibit high (or improved) luminescence efficiency and high (or improved) color purity.

Electron Transport Region

The electron transport region 153 may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron transport region 153 may include at least one layer selected from a buffer layer, a hole blocking layer, an electron control layer, an electron transport layer, and an electron injection layer, but embodiments of the present disclosure are not limited thereto.

For example, the electron transport region 153 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein layers in each structure are sequentially stacked on the emission layer 152. However, embodiments of the present disclosure are not limited thereto.

The electron transport region 153 (for example, a buffer layer, a hole blocking layer, an electron control layer, and/or an electron transport layer in the electron transport region 153) may include a metal-free compound containing at least one π electron-depleted nitrogen-containing ring.

The "π electron-deficient nitrogen-containing ring" as used herein indicates a $C_1$-$C_{60}$ heterocyclic group having at least one *—N=*' moiety as a ring-forming moiety.

In one or more embodiments, the "π electron-deficient nitrogen-containing ring" may be i) a 5-membered to 7-membered heteromonocyclic group having at least one *—N=*' moiety, ii) a heteropolycyclic group in which two or more 5-membered to 7-membered heteromonocyclic groups, each having at least one *—N=*' moiety, are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π electron-deficient nitrogen-containing ring are an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

For example, the electron transport region 153 may include a compound represented by Formula 601:

$$[Ar_{601}]_{xe11}\text{-}[(L_{601})_{xe1}\text{-}R_{601}]_{xe21},\quad \text{Formula 601}$$

wherein, in Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$), —C(=O)($Q_{601}$), —S(=O)$_2$($Q_{601}$), and —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one or more embodiments, at least one of $Ar_{601}$(s) in the number of xe11 and $R_{601}$(s) in the number of xe21 may include the π electron-deficient nitrogen-containing ring.

In one or more embodiments, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazone group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more of $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

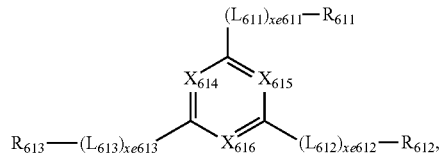

Formula 601-1 wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazone group, a $C_1$-$C_{20}$ alkyl group, a $C_1$-$C_{20}$ alkoxy group, a phenyl group, a biphenyl group, a terphenyl group, and a naphthyl group.

In one or more embodiments, $L_{601}$ and $L_{611}$ to $L_{613}$ in Formulae 601 and 601-1 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ may each be the same as described above.

In one or more embodiments, the electron transport region 153 may include at least one compound selected from Compounds ET1 to ET36, but embodiments of the present disclosure are not limited thereto:

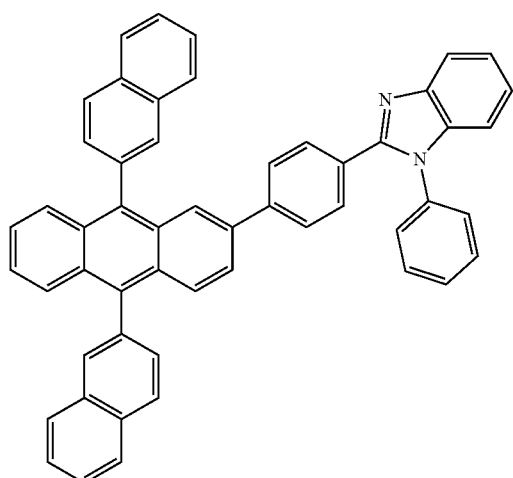

ET1

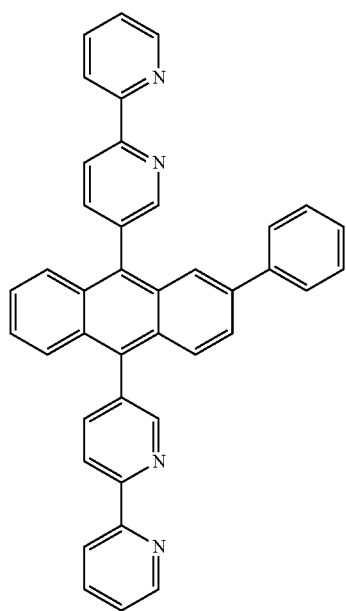

ET2

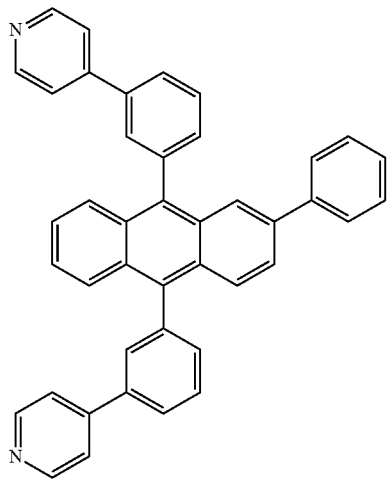

ET3

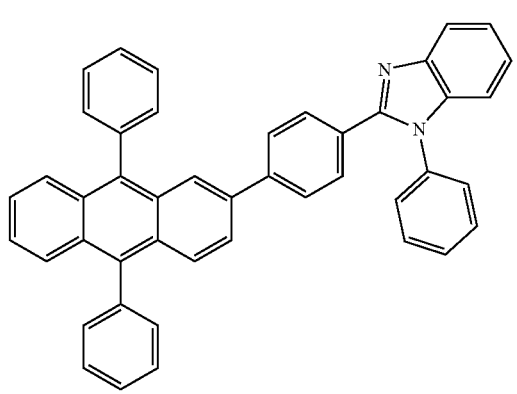

ET4

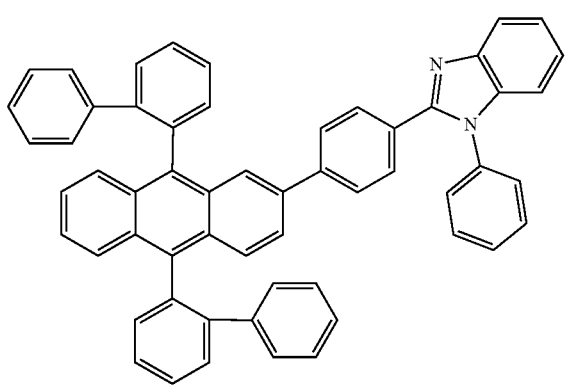

ET5

ET6
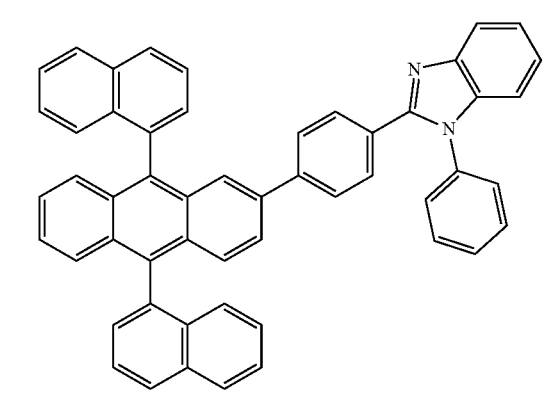
ET7
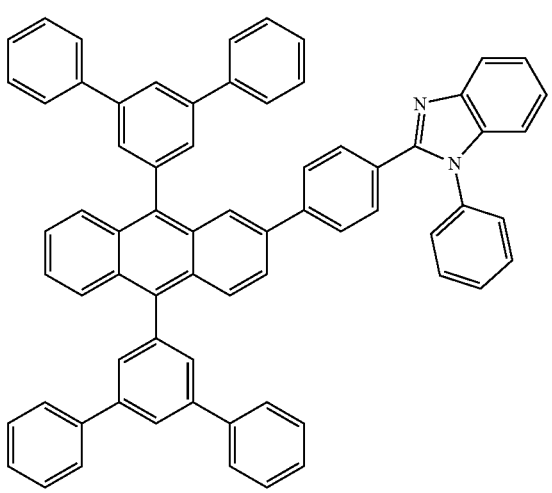
ET8
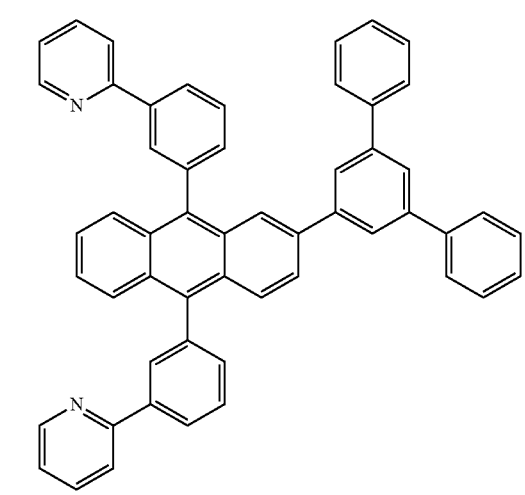
ET9
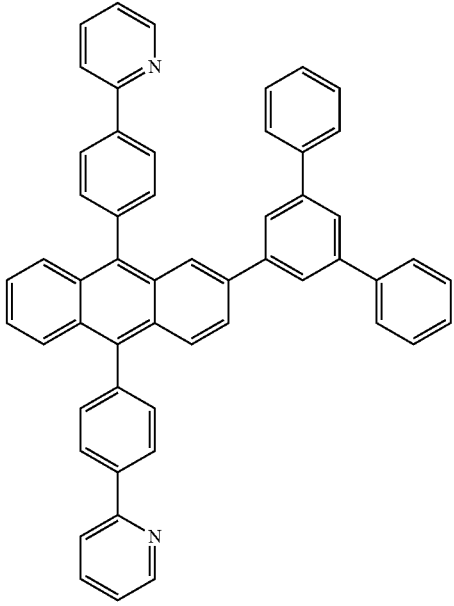
ET10
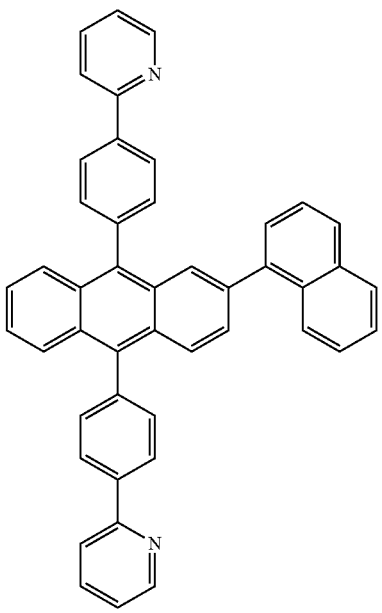

ET11
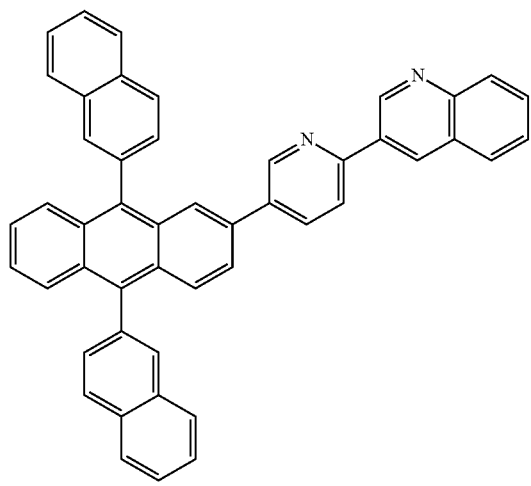
ET12
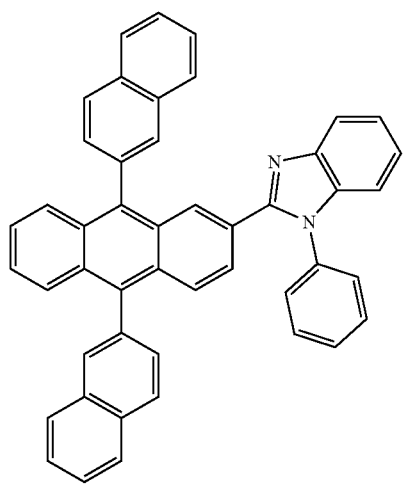
ET13
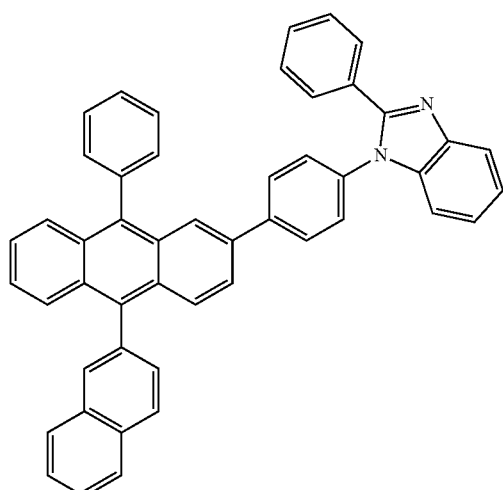
ET14
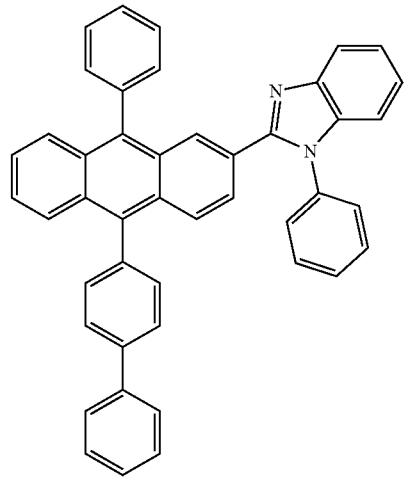
ET15
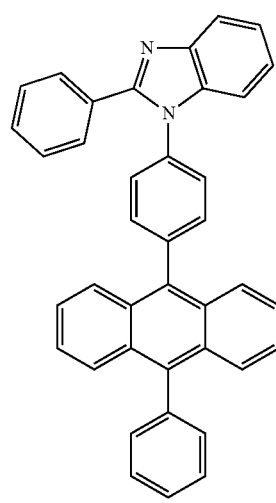
ET16
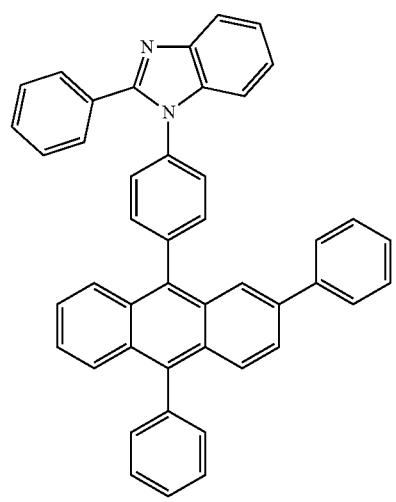

ET17
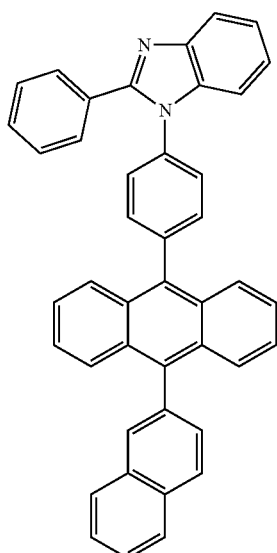
1p;2p
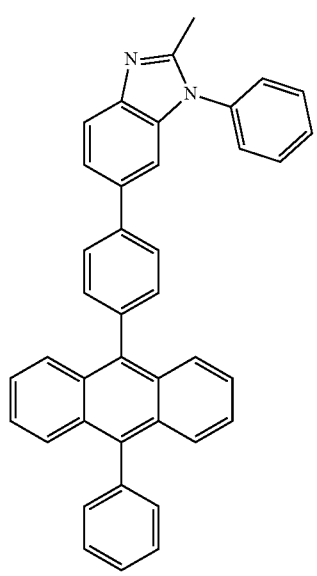
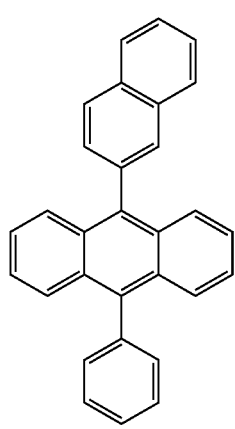
ET18
ET19
ET20
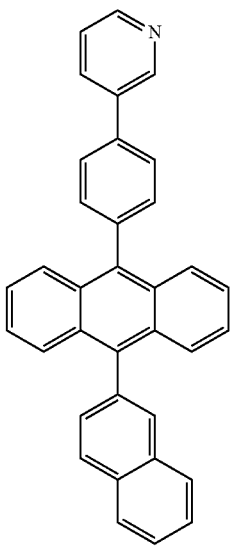
ET21
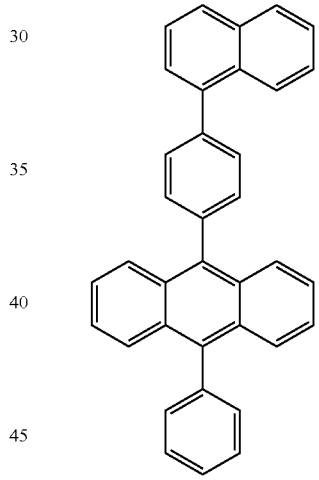
ET22
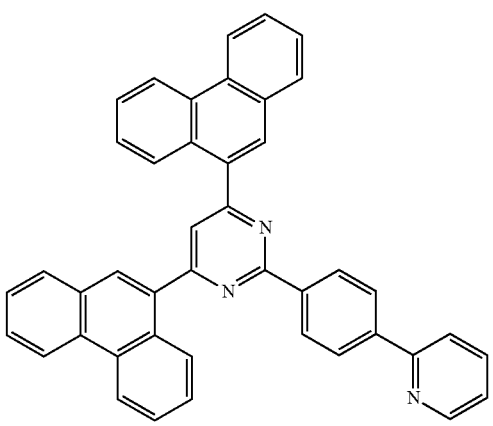

ET23
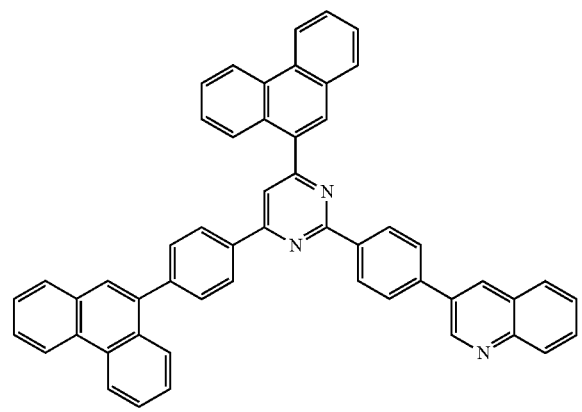
ET24
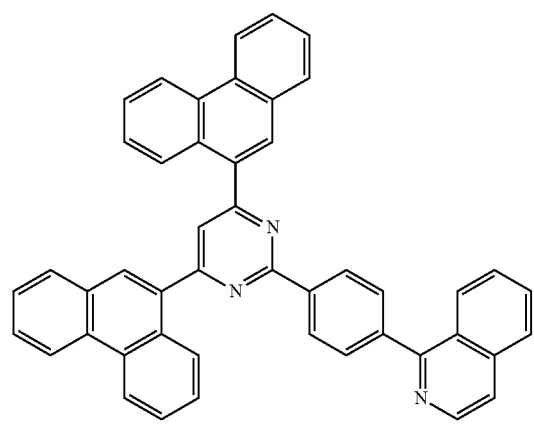
ET25
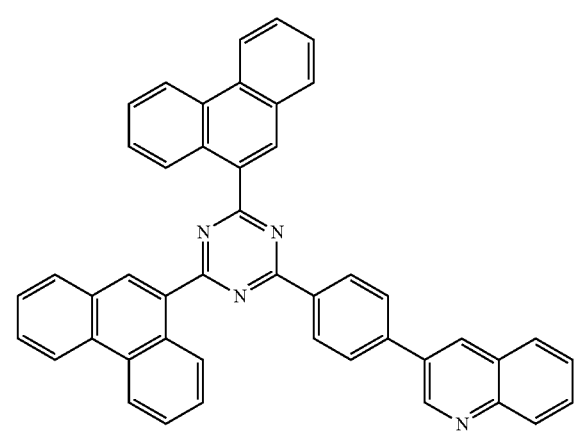
ET26
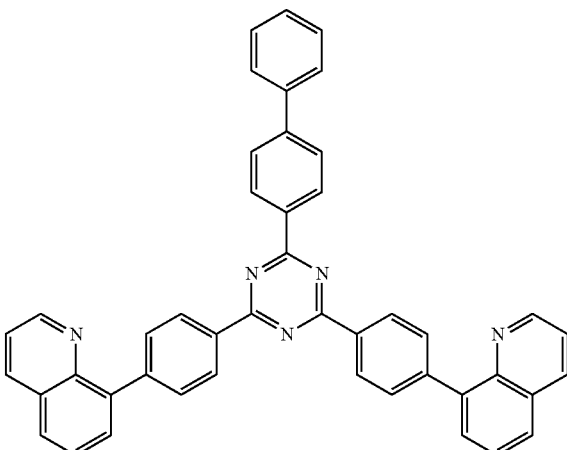
ET27
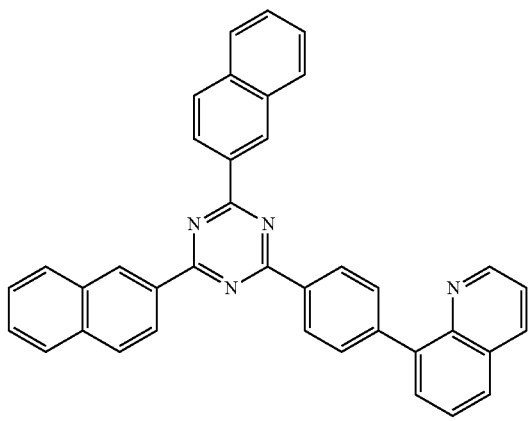
ET28
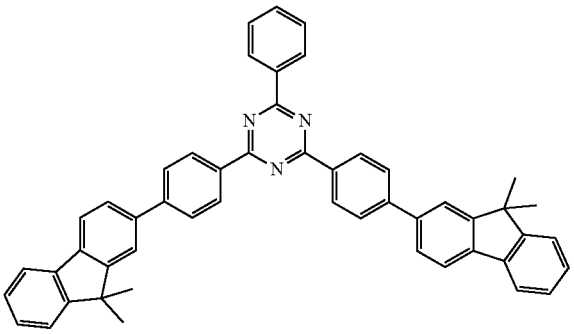

ET29
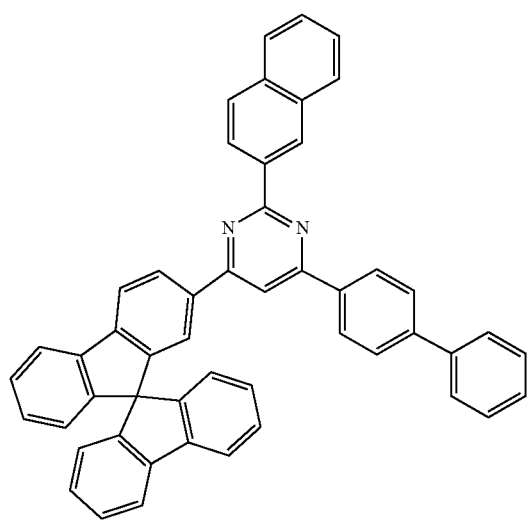
ET30
ET31
ET32
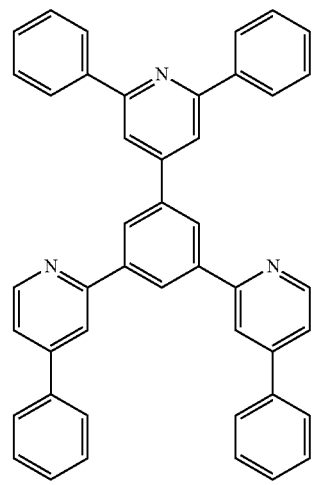
ET33
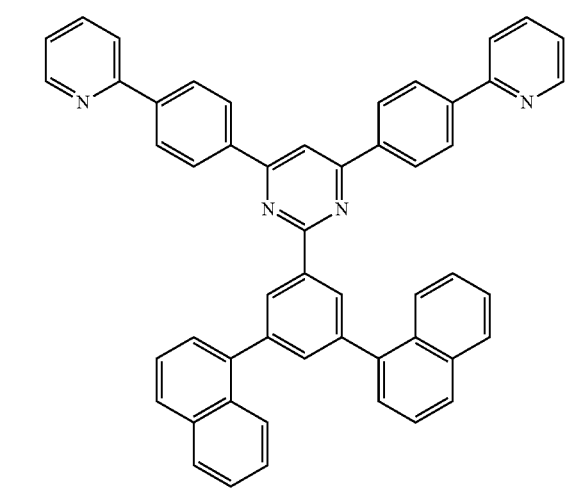
ET34
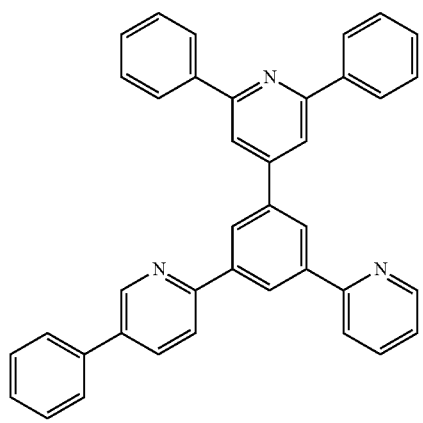

-continued

ET35

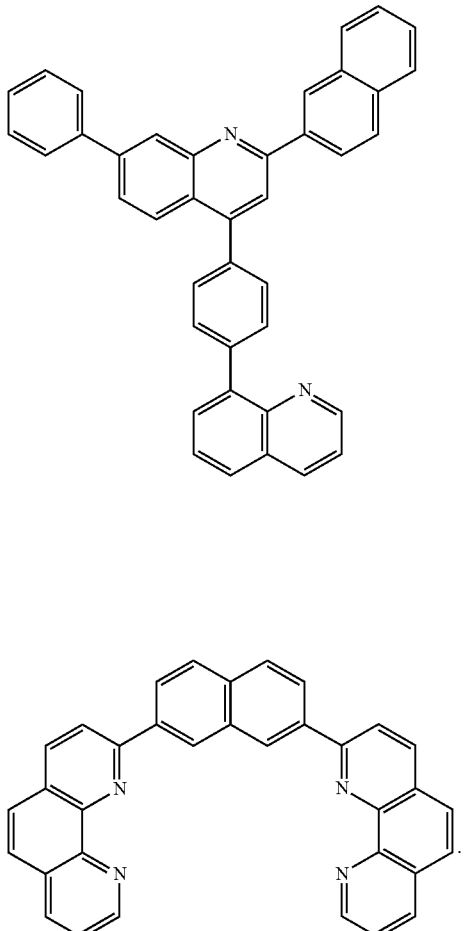

ET36

In one or more embodiments, the electron transport region 153 may include at least one selected from 2,9-dimethyl-4,7-diphenyl-1,10-phenanthroline (BCP), 4,7-diphenyl-1,10-phenanthroline (Bphen), Alq₃, BAlq, 3-(biphenyl-4-yl)-5-(4-tert-butylphenyl)-4-phenyl-4H-1,2,4-triazole (TAZ), and NTAZ:

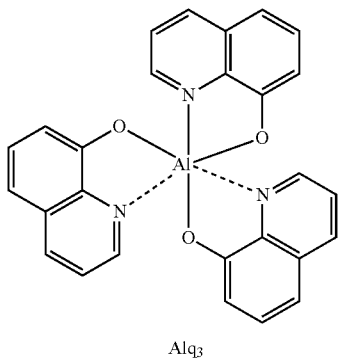

Alq₃

-continued

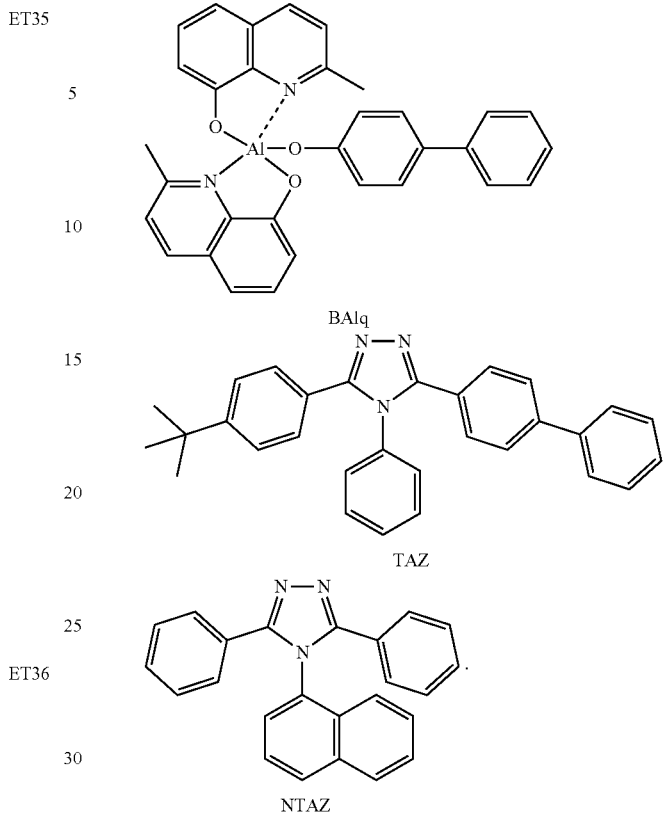

BAlq

TAZ

NTAZ

A thickness of the buffer layer, the hole blocking layer, or the electron control layer may each independently be in a range of about 20 Å to about 1,000 Å, for example, about 30 Å to about 300 Å. When the thickness(es) of the buffer layer, the hole blocking layer, and/or the electron control layer are within these ranges, excellent (or improved) hole blocking characteristics and/or excellent (or improved) electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within these ranges, satisfactory (or suitable) electron transport characteristics may be obtained without a substantial increase in driving voltage.

The electron transport region 153 (for example, an electron transport layer in the electron transport region 153) may further include, in addition to the materials described above, a metal-containing material.

The metal-containing material may include at least one selected from an alkali metal complex and an alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may each independently be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, and a cyclopentadiene, but embodiments of the present disclosure are not limited thereto.

For example, the metal-containing material may include a Li complex. The Li complex may include, for example, Compound ET-D1 (lithium quinolin-8-olate, LiQ) and/or Compound ET-D2:

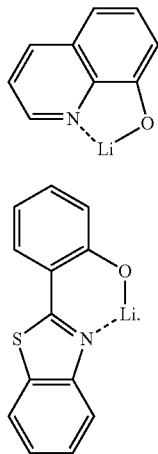

ET-D1

ET-D2

The electron transport region 153 may include an electron injection layer that facilitates the injection of electrons from the second electrode 190. The electron injection layer may directly contact the second electrode 190.

The electron injection layer may have i) a single-layered structure including (e.g., consisting of) a single layer including (e.g., consisting of) a single material, ii) a single-layered structure including (e.g., consisting of) a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

In one or more embodiments, the alkali metal may be selected from Li, Na, K, Rb, and Cs. In one or more embodiments, the alkali metal may be Li, Na, and/or Cs. In one or more embodiments, the alkali metal may be Li and/or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may each independently be selected from oxides and halides (for example, fluorides, chlorides, bromides, and/or iodides) of the alkali metal, the alkaline earth-metal, and the rare earth metal, respectively.

The alkali metal compound may be selected from alkali metal oxides (such as $Li_2O$, $Cs_2O$, and/or $K_2O$), and alkali metal halides (such as LiF, NaF, CsF, KF, LiI, NaI, CsI, KI, and/or RbI), and/or the like. In one or more embodiments, the alkali metal compound may be selected from LiF, $Li_2O$, NaF, LiI, NaI, CsI, and KI, but embodiments of the present disclosure are not limited thereto.

The alkaline earth-metal compound may be selected from alkaline earth-metal oxides, such as BaO, SrO, CaO, $Ba_xSr_{1-x}O$ (wherein 0<x<1), $Ba_xCa_{1-x}O$ (wherein 0<x<1), and/or the like. In one or more embodiments, the alkaline earth-metal compound may be selected from BaO, SrO, and CaO, but embodiments of the present disclosure are not limited thereto.

The rare earth metal compound may be selected from $YbF_3$, $ScF_3$, $Sc_2O_3$, $Y_2O_3$, $Ce_2O_3$, $GdF_3$ and $TbF_3$. In one or more embodiments, the rare earth metal compound may be selected from $YbF_3$, $ScF_3$, $TbF_3$, $YbI_3$, $ScI_3$, and $TbI_3$, but embodiments of the present disclosure are not limited thereto.

The alkali metal complex, the alkaline earth-metal complex, and the rare earth metal complex may respectively include an ion of alkali metal, alkaline earth-metal, and rare earth metal as described above, and a ligand coordinated with a metal ion of the alkali metal complex, the alkaline earth-metal complex, or the rare earth metal complex may each independently be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

In one or more embodiments, the electron injection layer may include (e.g., may consist of) an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within these ranges, satisfactory (or suitable) electron injection characteristics may be obtained without a substantial increase in driving voltage.

Second Electrode

As described above, the light-emitting device 100 includes the second electrode 190 facing the first electrode 110. The second electrode 190 may be the same as described herein.

For example, the second electrode 190 may be a cathode and a transparent electrode, and may include $InSnO_x$ (ITO), Ga-doped ZnO (GZO), In-doped ZnO (IZO), Al-doped ZnO (AZO), $InZnSnO_x$ (IZTO), $ZnSnO_x$ (ZTO), or any combination thereof.

For example, the second electrode 190 may include a bottom electrode and a top electrode, wherein the bottom electrode and the top electrode may each independently include InSnO$_x$ (ITO), GZO, IZO, AZO, InZnSnO$_x$ (IZTO), ZnSnO$_x$ (ZTO), or any combination thereof.

Hereinbefore, the light-emitting device 100 according to one or more embodiments has been described in connection with FIG. 2, but embodiments of the present disclosure are not limited thereto.

Respective layers included in the light-emitting device may be formed in a certain region by using one or more suitable methods selected from vacuum deposition, spin coating, casting, Langmuir-Blodgett (LB) deposition, ink-jet printing, laser-printing, and laser-induced thermal imaging.

When the layers are each independently formed by vacuum deposition, the deposition conditions include, for example, a deposition temperature in a range of about 100° C. to about 500° C., a vacuum degree in a range about $10^{-8}$ torr to about $10^{-3}$ torr, and a deposition speed in a range about 0.01 Å/sec to about 100 Å/sec, by taking into account a material to be included in a layer to be formed and a structure of a layer to be formed.

When the layers are each independently formed by spin coating, the coating conditions include, for example, a coating speed in a range of about 2,000 rpm to about 5,000 rpm and a heat treatment temperature in a range of about 80° C. to about 200° C., by taking into account a material to be included in a layer to be formed and a structure of a layer to be formed.

Display Apparatus

The light-emitting device may be included in a display apparatus including a thin-film transistor. The thin-film transistor may include a source electrode, a drain electrode, and an activation layer, wherein any one of the source electrode and the drain electrode may be electrically connected (e.g., electrically coupled) to the first electrode of the light-emitting device.

The thin-film transistor may further include a gate electrode, a gate insulating film, and/or the like.

The active layer may include crystalline silicon, amorphous silicon, an organic semiconductor, an oxide semiconductor, and/or the like, but embodiments of the present disclosure are not limited thereto.

The display apparatus may further include a sealing portion for sealing the light-emitting device. The sealing portion may allow an image from the light-emitting device to be implemented, and may block or reduce outside air and/or moisture from penetrating into the light-emitting device. The sealing portion may be a sealing substrate including a transparent glass and/or a plastic substrate. The sealing portion may be a thin-film encapsulation layer including a plurality of organic layers and/or a plurality of inorganic layers. When the sealing portion is a thin-film encapsulation layer, the entire flat display apparatus may be flexible.

Optical Member and Apparatus

One or more embodiments of the present disclosure provide an optical member including the quantum dots.

The optical member may be a color conversion member.

The color conversion member may include a substrate and a pattern layer formed on the substrate.

The substrate may be a substrate constituting the color conversion member (e.g., a substrate utilized specifically for the color conversion member), or may be a region of various apparatuses (for example, a display apparatus) in which the color conversion member is arranged. The substrate may be formed of glass, silicon (Si), silicon oxide (SiO$_x$), and/or a polymer, wherein the polymer may be polyethersulfone (PES) and/or polycarbonate (PC).

The pattern layer may include quantum dots in the form of a thin film. For example, the pattern layer may be a thin-film quantum dot layer.

The color conversion member including the substrate and the pattern layer may further include a partition wall and/or a black matrix formed between the pattern layers. In one or more embodiments, the color conversion member may further include a color filter to further improve light conversion efficiency.

The color conversion member may include a red pattern layer capable of emitting (e.g., to emit) red light, a green pattern layer capable of emitting (e.g., to emit) green light, a blue pattern layer capable of emitting (e.g., to emit) blue light, or any combination thereof. The red pattern layer, the green pattern layer, and/or the blue pattern layer may be implemented by controlling a component, a composition, and/or a structure of the quantum dots.

One or more embodiments of the present disclosure provide an apparatus including the quantum dot (and/or, the optical member including the quantum dots).

The apparatus may further include a light source, and the quantum dots (and/or the optical member including the quantum dots) may be arranged in the path of light emitted from the light source.

The light source may emit blue light, red light, green light, and/or white light.

For example, the light source may emit blue light.

The light source may be an organic light-emitting device (OLED) and/or a light-emitting diode (LED).

Light emitted from the light source as described above may be photoconverted by the quantum dots while passing through the quantum dots. Accordingly, due to the quantum dots, light having a different wavelength from the light emitted from the light source may be emitted.

The apparatus may be a display apparatus, a lighting apparatus, and/or the like.

Figure 3:
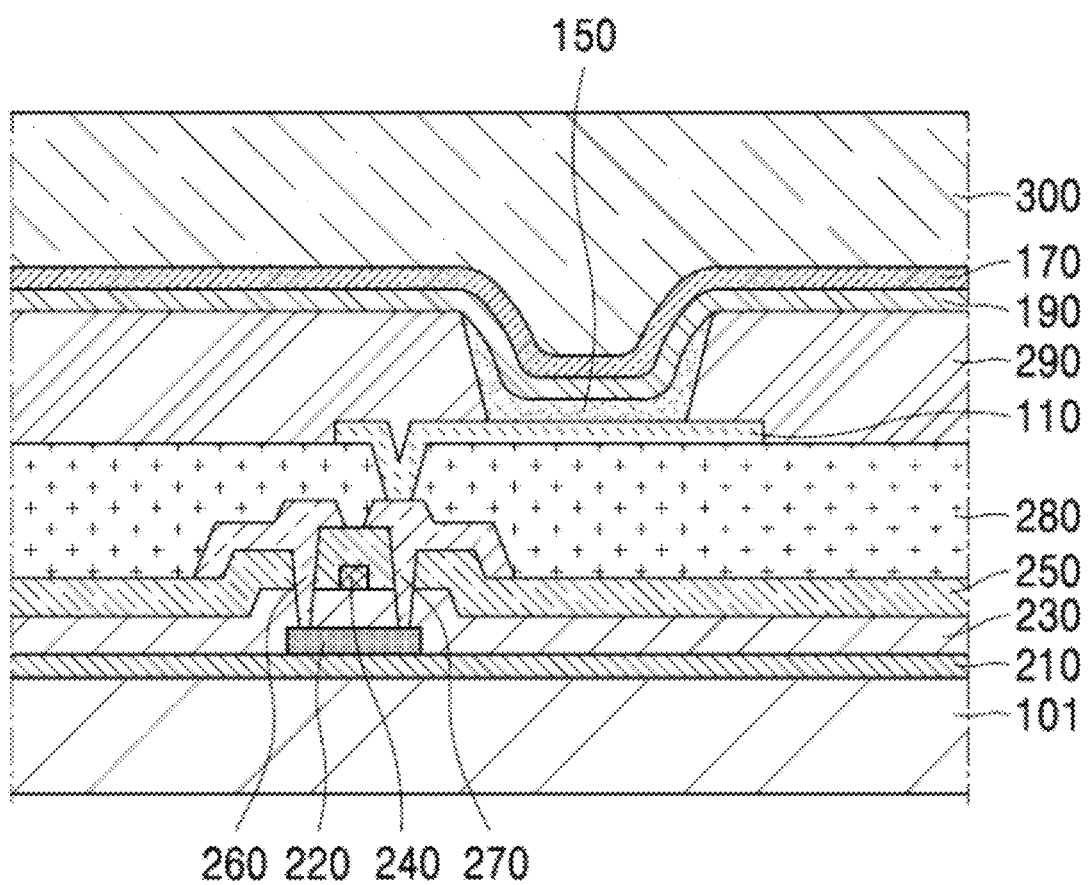
FIGS. 3 and 4 are each a schematic cross-sectional view of a light-emitting apparatus according to one or more embodiments.
Figure 4:
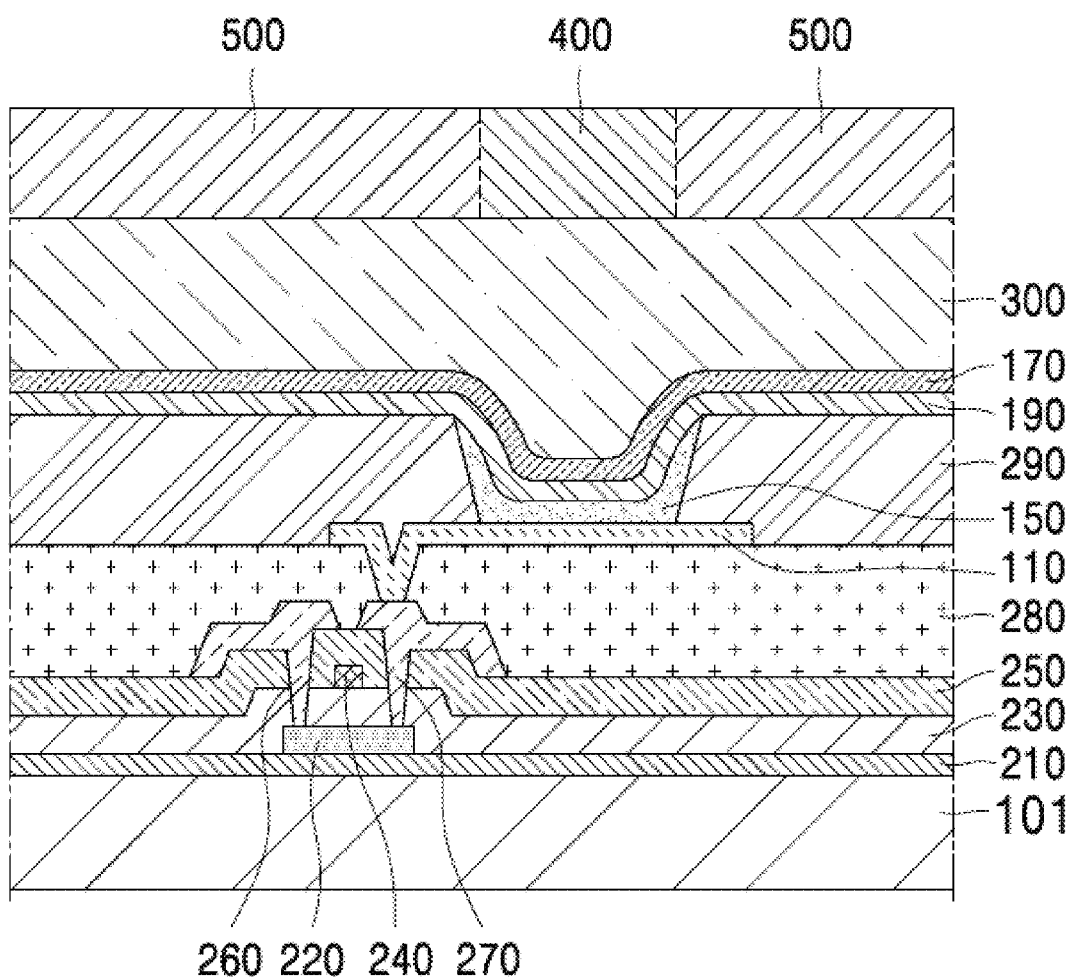
Figure 5A:
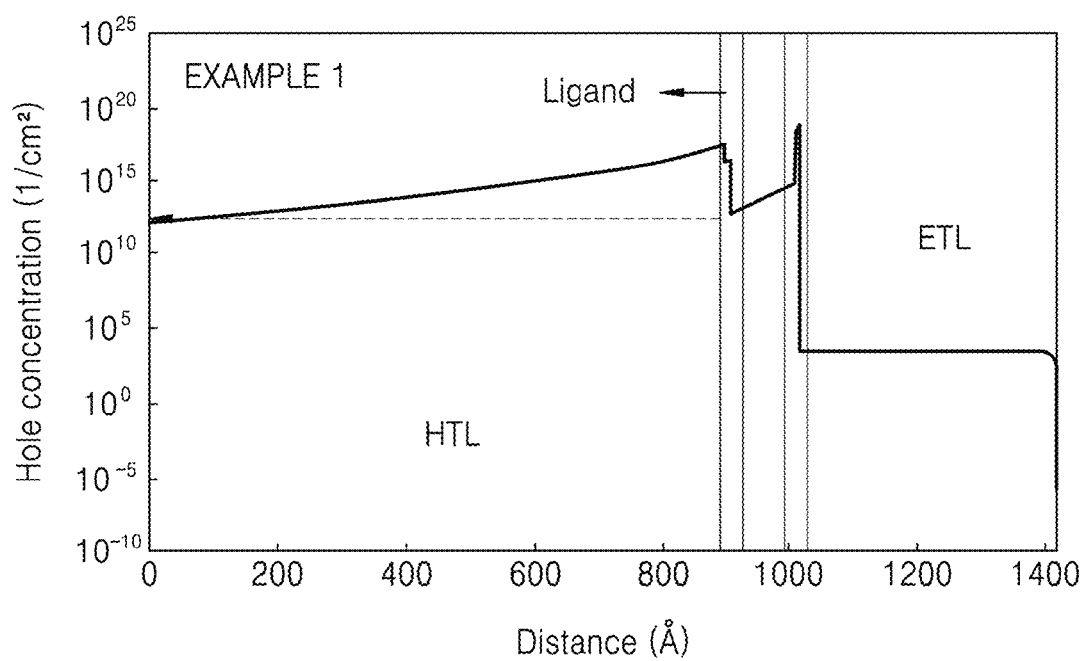
FIGS. 5A-5D are simulation graphs showing a concentration of holes injected into a layer including quantum dots in light-emitting devices of Example 1 and Comparative Examples 1 to 3, respectively.
Figure 5B:
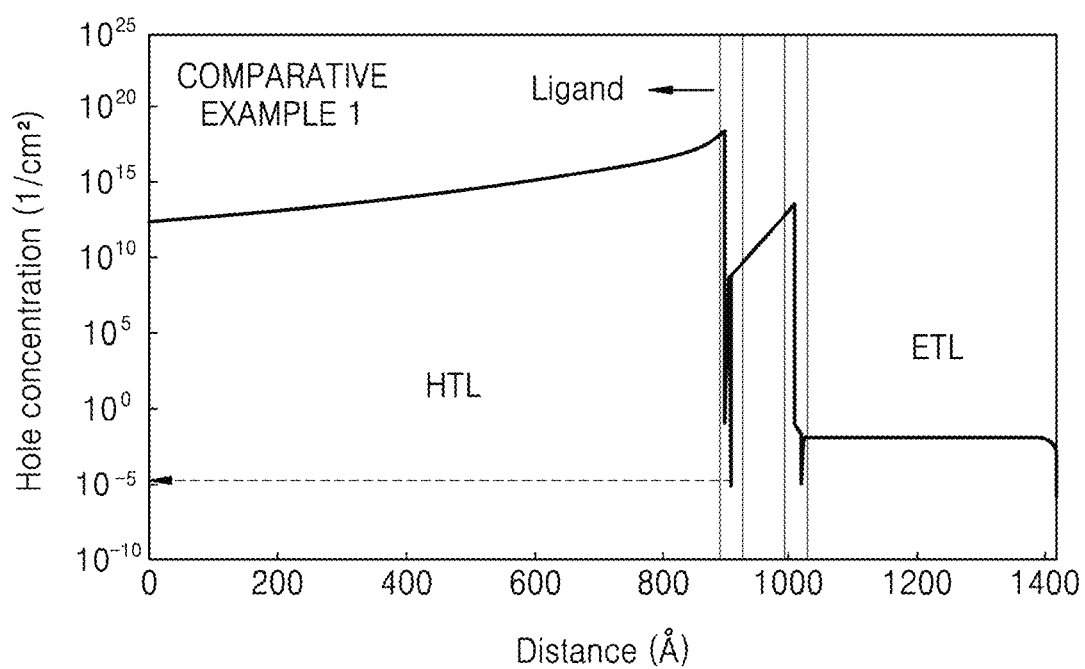
Figure 5C:
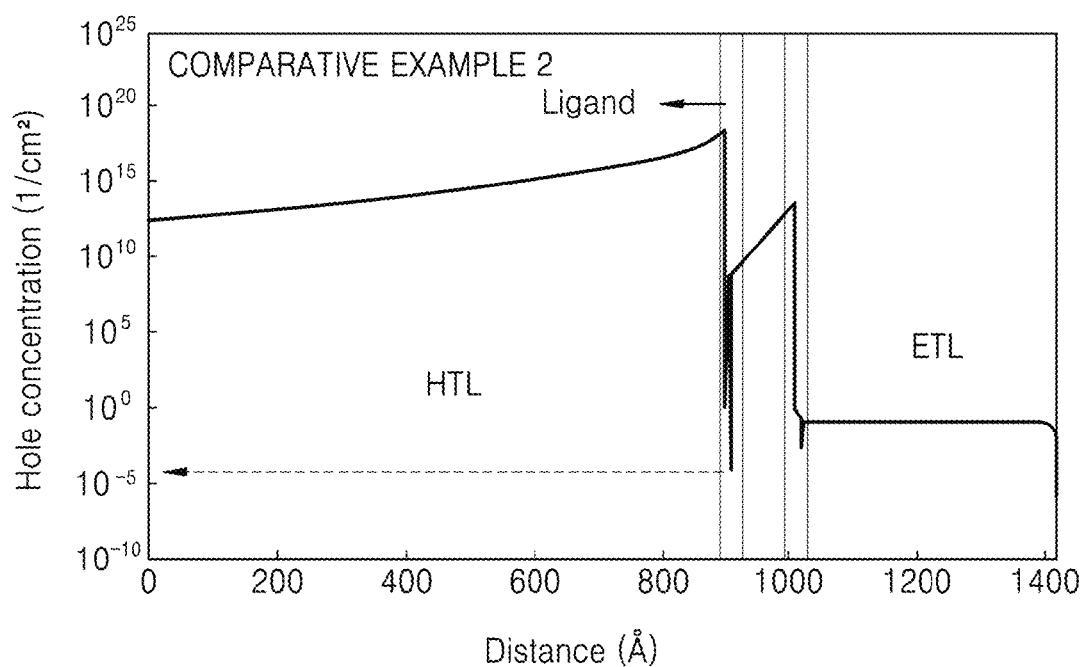
Figure 5D:
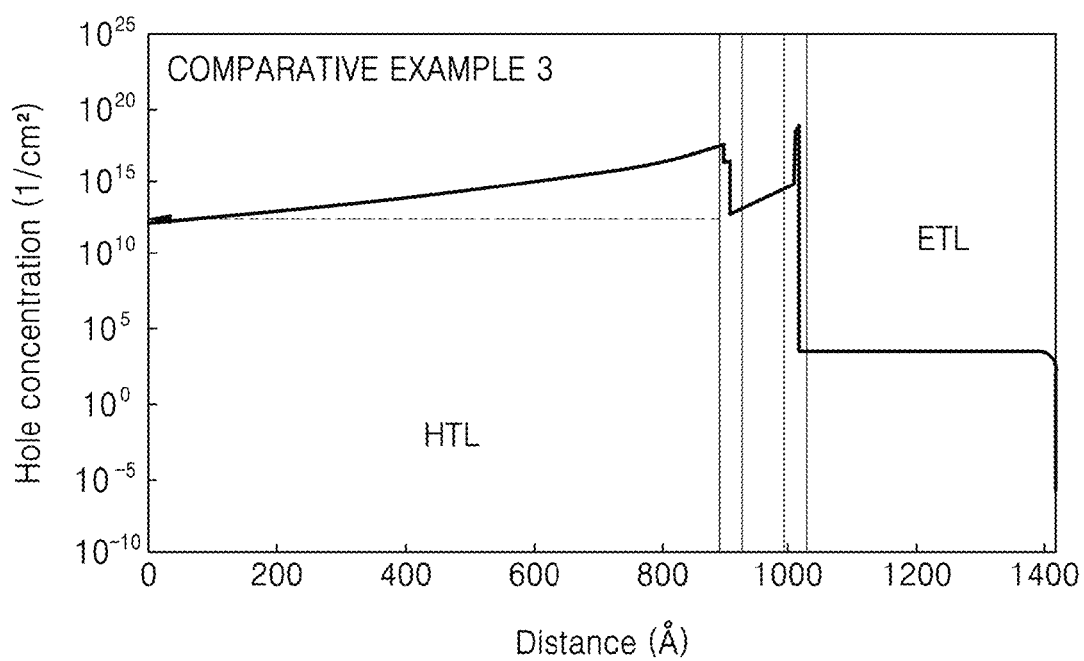
Figure 6A:
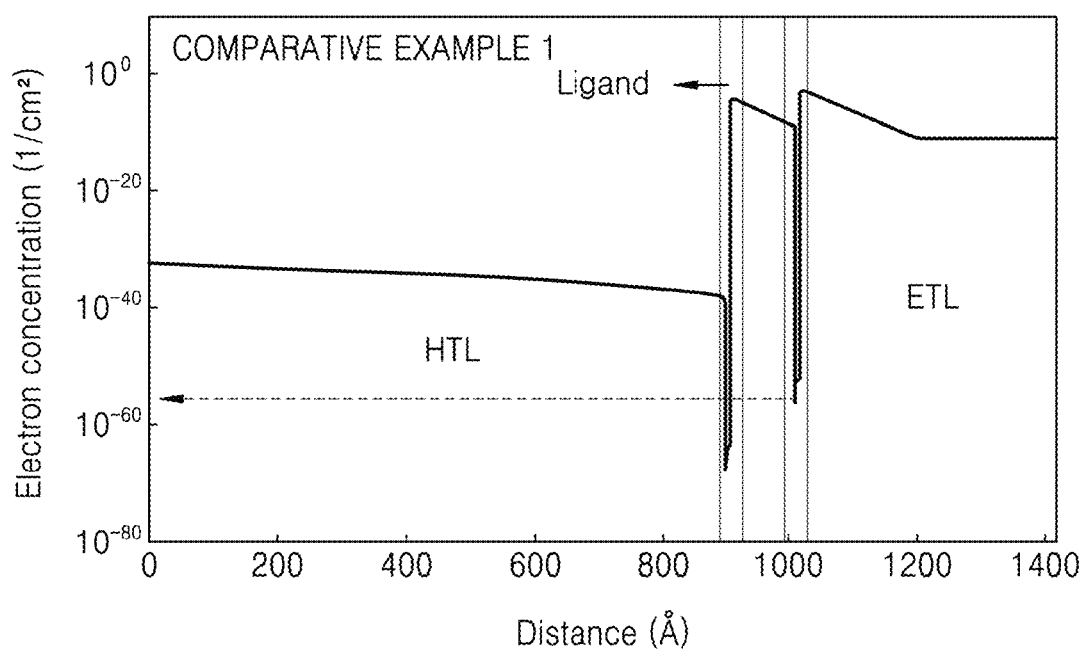
FIGS. 6A-6D are simulation graphs showing a concentration of electrons injected into a layer including quantum dots in light-emitting devices of Example 1 and Comparative Examples 1 to 3, respectively.
Figure 6B:
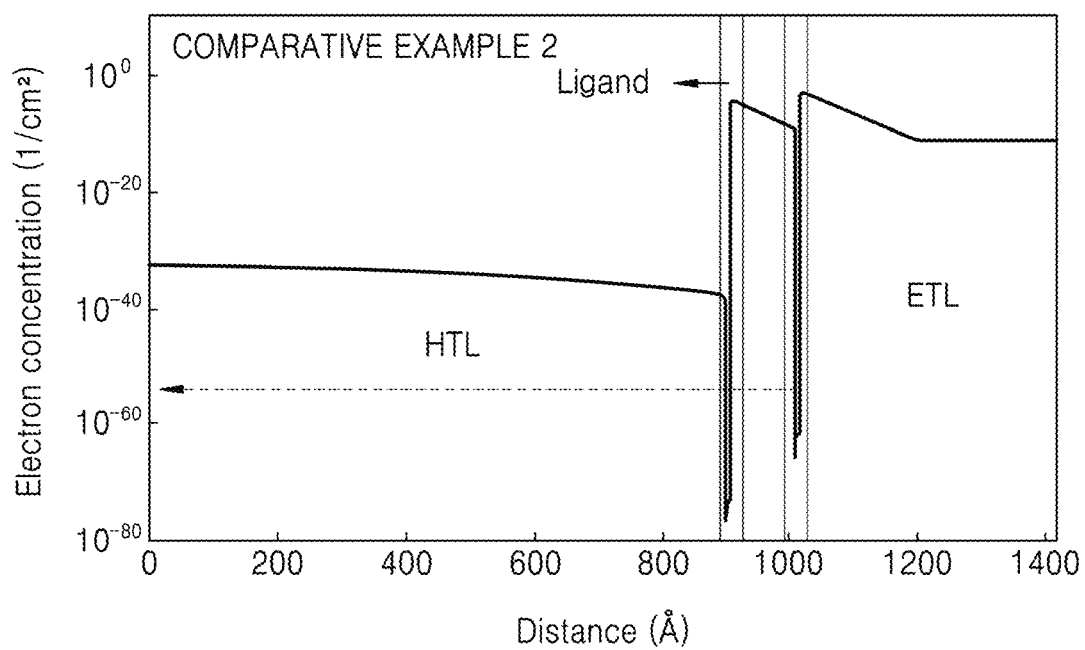
Figure 6C:
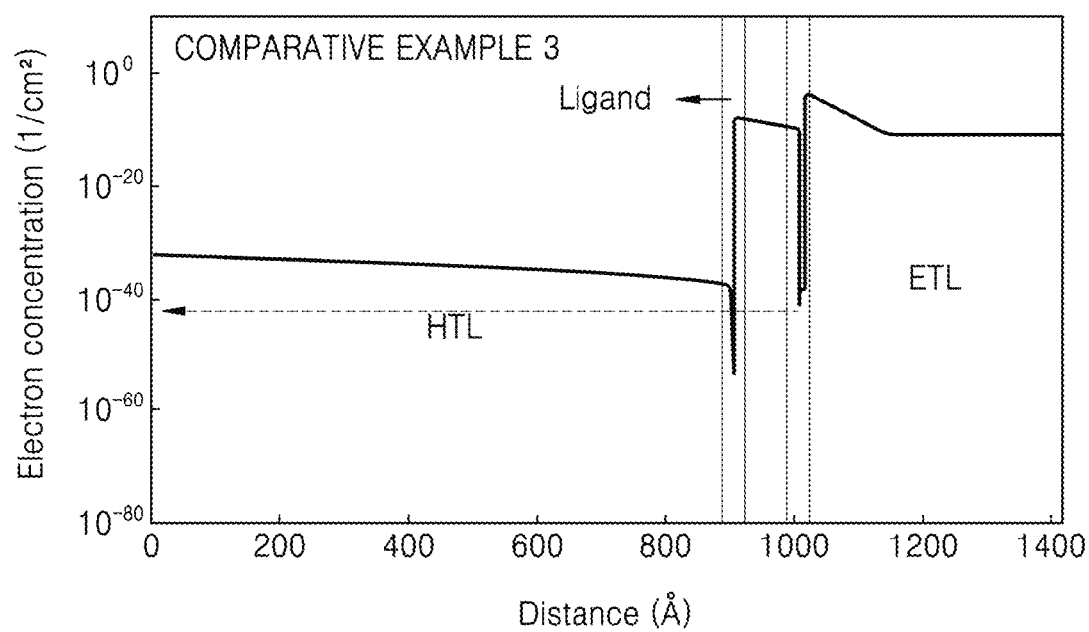
Figure 6D:
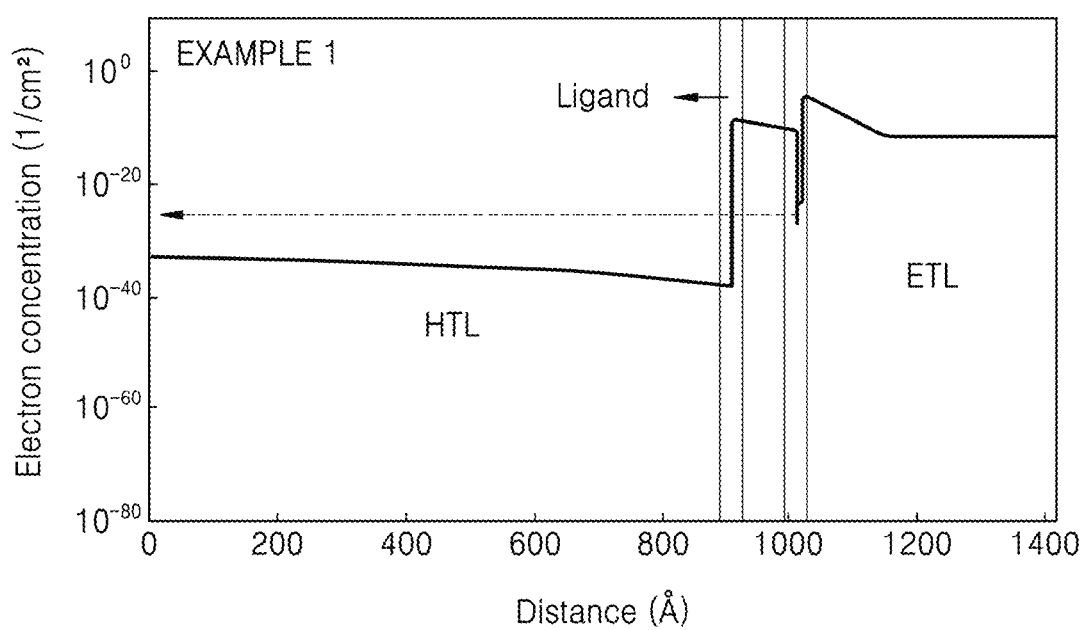

Description of FIGS. 3 and 4

FIG. 3 is a cross-sectional view showing a light-emitting apparatus according to one or more embodiments.

The light-emitting apparatus of FIG. 3 includes a substrate 101, a thin-film transistor (TFT), a light-emitting device, and an encapsulation portion 300 that seals the light-emitting device.

The substrate 101 may be a flexible substrate, a glass substrate, and/or a metal substrate. A buffer layer 210 may be on the substrate 101. The buffer layer 210 may prevent or reduce penetration of impurities through the substrate 101 and may provide a flat (or substantially flat) surface on the substrate 101.

A TFT may be on the buffer layer 210. The TFT may include an activation layer 220, a gate electrode 240, a source electrode 260, and a drain electrode 270.

The activation layer 220 may include an inorganic semiconductor (such as silicon and/or polysilicon), an organic semiconductor, and/or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 may be inbetween the gate electrode 240 and the source electrode 260 to insulate the gate electrode 240 from the source electrode 260, and may be inbetween the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may be arranged to expose the source region and the drain region of the activation layer 220, and the source electrode 260 and the drain electrode 270 may be in contact (e.g., in physical contact) with the exposed portions of the source region and the drain region of the activation layer 220.

The TFT may be electrically connected (e.g., electrically coupled) to a light-emitting device to drive the light-emitting device, and may be covered by a passivation layer 280. The passivation layer 280 may include an inorganic insulating film, an organic insulating film, or a combination thereof. The light-emitting device may be provided on the passivation layer 280. The light-emitting device may include the first electrode 110, an interlayer 150, and the second electrode 190.

The first electrode 110 may be on the passivation layer 280. The passivation layer 280 may expose a portion of the drain electrode 270 without completely covering the drain electrode 270, and the first electrode 110 may be arranged to be connected (e.g., coupled) to the exposed portion of the drain electrode 270.

A pixel defining layer 290 containing an insulating material may be on the first electrode 110. The pixel defining layer 290 may expose a region of the first electrode 110, and the interlayer 150 may be formed in the exposed region of the first electrode 110. The pixel defining layer 290 may be a polyimide organic film and/or a polyacrylic organic film. At least some layers of the interlayer 150 may extend beyond the upper portion of the pixel defining layer 290 and may thus be arranged in the form of a common layer.

The second electrode 190 may be on the interlayer 150, and a capping layer 170 may be additionally formed on the second electrode 190. The capping layer 170 may be formed to cover the second electrode 190.

The encapsulation portion 300 may be on the capping layer 170. The encapsulation portion 300 may be on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or any combination thereof; or a combination of the inorganic film and the organic film.

FIG. 4 is a cross-sectional view showing a light-emitting apparatus according to one or more other embodiments. The light-emitting apparatus of FIG. 4 is substantially the same as the light-emitting apparatus of FIG. 3, except that a light-blocking pattern 500 and a functional region 400 are additionally on the encapsulation portion 300. The functional region 400 may include i) a color filter area, ii) a color conversion area, or iii) a combination of the color filter area and the color conversion area. In one or more embodiments, the light-emitting device included in the light-emitting apparatus of FIG. 4 may be a tandem light-emitting device.

General Definition of Substituents

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, a hexyl group, and the like. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle and/or at either terminus of the $C_2$-$C_{60}$ alkyl group, and examples thereof include an ethenyl group, a propenyl group, a butenyl group, and the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle and/or at either terminus of the $C_2$-$C_{60}$ alkyl group, and examples thereof include an ethynyl group, a propynyl group, and the like. The term "$C_1$-$C_{60}$ alkynylene group" as used herein refers to a divalent group having the same structure as the $C_1$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, an isopropyloxy group, and the like.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, a cycloheptyl group, and the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one hetero atom selected from N, O, Si, P, and S as a ring-forming atom and 1 to 10 carbon atoms, and examples thereof include a 1,2,3,4-oxatriazolidinyl group, a tetrahydrofuranyl group, a tetrahydrothiophenyl group, and the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, at least one double bond in its ring, and no aromaticity. Examples of the $C_1$-$C_{10}$ heterocycloalkenyl group include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, a chrysenyl group, and the like. The term "$C_6$-$C_{60}$ arylene group" as used herein refers to a divalent group having the same structure as the $C_6$-$C_{60}$ aryl group. When the $C_6$-$C_{60}$ aryl group and the $C_6$-$C_{60}$ arylene group each independently include two or more rings, the respective two or more rings may be condensed with each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, a carbazolyl group, and the like. The term "$C_1$-$C_{60}$ heteroarylene group" as used herein refers to a divalent group having the same structure as the $C_1$-$C_{60}$ heteroaryl group. When the $C_1$-$C_{60}$ heteroaryl group and the $C_1$-$C_{60}$ heteroarylene group each independently include two or more rings, the respective two or more rings may be condensed with each other.

The term "$C_6$-$C_{60}$ aryloxy group" as used herein may refer to a monovalent group represented by —$OA_{102}$ (wherein $A_{102}$ is the $C_6$-$C_{60}$ aryl group), and the term "$C_6$-$C_{60}$ arylthio group" as used herein may refer to a monovalent group represented by —$SA_{103}$ (wherein $A_{103}$ is the $C_6$-$C_{60}$ aryl group).

The term "monovalent non-aromatic condensed polycyclic group" as used herein refers to a monovalent group having two or more rings condensed to each other, only carbon atoms (for example, 8 to 60 carbon atoms) as ring-forming atoms, and no aromaticity in its entire molecular structure (e.g., the molecular structure as a whole in non-aromatic). Examples of the monovalent non-aromatic condensed polycyclic group include a fluorenyl group and the like. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom selected from N, O, Si, P, and S, other than carbon atoms (for example, 1 to 60 carbon atoms), as a ring-forming atom, and no aromaticity in its entire molecular structure (e.g., the molecular structure as a whole in non-aromatic). Examples of the monovalent non-aromatic condensed heteropolycyclic group include carbazolyl group, 1,2,3,4-tetrahydroquinolinyl group, 9H-xanthenyl group and the like. The term "divalent non-aromatic condensed heteropolycyclic group" as used herein refers to a divalent group having the same structure as a monovalent non-aromatic condensed heteropolycyclic group.

The term "$C_4$-$C_{60}$ carbocyclic group" (e.g., "$C_5$-$C_{60}$ carbocyclic group") as used herein refers to a monocyclic or polycyclic group having 4 to 60 (e.g., 5 to 60) carbon atoms in which a ring-forming atom is a carbon atom only. The term "$C_4$-$C_{60}$ carbocyclic group" (e.g., "$C_5$-$C_{60}$ carbocyclic group") as used herein refers to an aromatic carbocyclic group or a non-aromatic carbocyclic group. The $C_4$-$C_{60}$ carbocyclic group (e.g., the $C_5$-$C_{60}$ carbocyclic group) may be a ring (such as benzene), a monovalent group (such as a phenyl group), or a divalent group (such as a phenylene group). For example, depending on the number of substituents connected to the $C_4$-$C_{60}$ carbocyclic group (e.g., the $C_5$-$C_{60}$ carbocyclic group), the $C_4$-$C_{60}$ carbocyclic group (e.g., the $C_5$-$C_{60}$ carbocyclic group) may be a trivalent group or a quadrivalent group.

The term "$C_1$-$C_{60}$ heterocyclic group" as used herein refers to a group having the same structure as the $C_4$-$C_{60}$ carbocyclic group, except that as a ring-forming atom, at least one heteroatom selected from N, O, Si, P, and S is used in addition to carbon atoms (the number of carbon atoms may be in a range of 1 to 60).

In the present specification, at least one substituent of the substituted $C_4$-$C_{60}$ carbocyclic group, the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

- deuterium, —F, —Cl, —Br, —I, a hydroxyl group, a cyano group, a nitro group, an amidino group, a hydrazino group, a hydrazone group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;
- a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen; deuterium; —F; —Cl; —Br; —I; a hydroxyl group; a cyano group; a nitro group; an amidino group; a hydrazino group; a hydrazone group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_1$-$C_{60}$ heteroaryl group; a monovalent non-aromatic condensed polycyclic group; a monovalent non-aromatic condensed heteropolycyclic group; a $C_1$-$C_{60}$ alkyl group substituted with at least one selected from deuterium, —F, and a cyano group; a $C_6$-$C_{60}$ aryl group substituted with at least one selected from deuterium, —F, and a cyano group; a biphenyl group; and a terphenyl group.

The term "Ph" as used herein refers to a phenyl group, the term "Me" as used herein refers to a methyl group, the term "Et" as used herein refers to an ethyl group, the term "tert-Bu" or "Bu$^t$" as used herein refers to a tert-butyl group, the term "OMe" as used herein refers to a methoxy group, and "D" refers to deuterium.

The term "biphenyl group" as used herein refers to "a phenyl group substituted with a phenyl group". For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and a light-emitting device according to embodiments will be described in more detail with reference to Examples.

EXAMPLES

Synthesis Example 1

Synthesis of Ligand 1

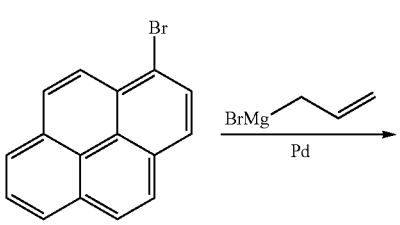

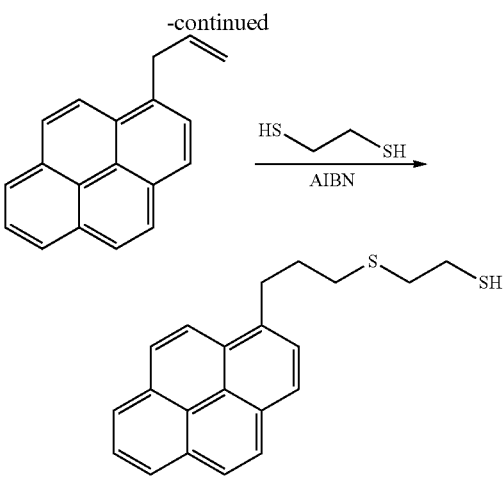

1 mmol of 1-bromopyrene and 1.5 mmol of allyl(bromo)magnesium were reacted in the presence of a Pd catalyst, so as to synthesize 1-allylpyrene.

1 mmol of 1-allylpyrene and 1.5 mmol of 1,2-ethanedithiol were reacted in the presence of AIBN, so as to synthesize Ligand 1.

Synthesis Example 2

Synthesis of Ligand 5

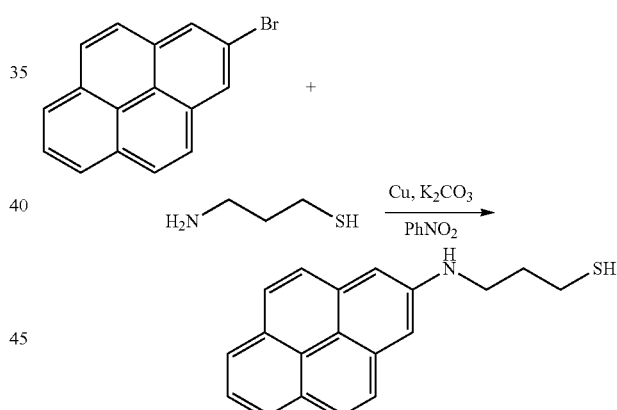

1 mmol of 2-bromopyrene and 1.5 mmol of 3-aminopropanethiol were reacted with $K_2CO_3$ and PhNO$_2$ in the presence of a Cu catalyst, so as to obtain Ligand 5.

Comparative Synthesis Example 1

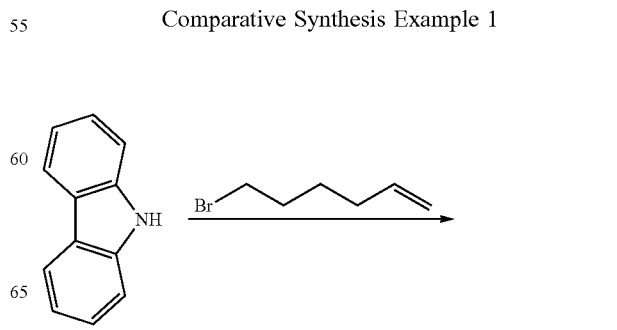

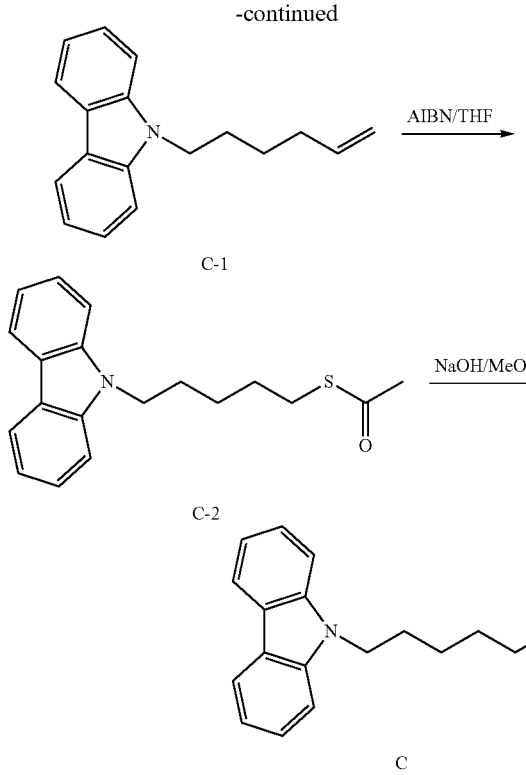

C-1

C-2

C

Intermediate C-1 was synthesized by a reaction between 1 mmol of carbazole and 1.5 mmol of 1-bromo-5-hexene.

Intermediate C-2 was synthesized by a reaction of 1 mmol of Intermediate C-1 in the presence of AIBN/THF.

1 mmol of Intermediate C-2 was reacted in the presence of NaOH/MeOH, so as to synthesize Ligand C.

Example 1

An InP/ZnSe/ZnS quantum dot solution and Ligand 1 of Synthesis Example 1 were mixed at a weight ratio of 1:0.2, and the mixed solution was ultrasonicated at room temperature for 30 minutes. An ITO substrate was spin-coated with a hole injection layer (HIL), hole transport layer (HTL), quantum dot emission layer (QD EML), and electron transport layer (ETL), and an Ag electrode was deposited on the ITO substrate to manufacture a light-emitting device.

Comparative Example 1

A light-emitting device was manufactured in substantially the same manner as in Example 1, except that Ligand A was used instead of Ligand 1.

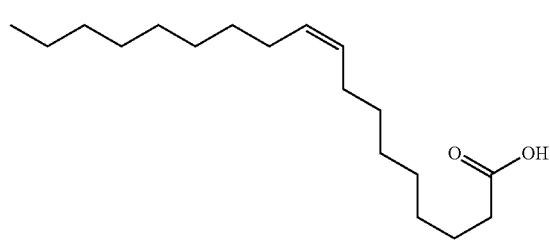

A

Comparative Example 2

A light-emitting device was manufactured in substantially the same manner as in Example 1, except that Ligand B was used instead of Ligand 1.

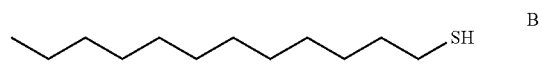

B

Comparative Example 3

A light-emitting device was manufactured in the same manner as in Example 1, except that Ligand C was used instead of Ligand 1.

Evaluation Example 1

The HOMO and LUMO energy levels of Ligand 1 of Example 1 and Ligands A to C of Comparative Examples 1 to 3 were evaluated using a Gaussian 09 program with molecular structure optimization by density functional theory (DFT) based on B3LYP, and results are shown in Table 1.

TABLE 1

|  | Ligand A | Ligand B | Ligand C | Ligand 1 |
|---|---|---|---|---|
| HOMO energy level (eV) | −6.382 | −6.316 | −5.284 | −5.286 |
| LUMO energy level (eV) | 0.293 | 0.804 | −0.601 | −1.536 |

In addition, regarding the light-emitting devices of Example 1 and Comparative Examples 1 to 3, the hole/electron charge injection characteristics were confirmed through simulation, and results are respectively shown in FIGS. 5A to 5D and 6A to 6D.

Referring to Table 1, it was confirmed that Ligand 1 according to the present disclosure showed a narrow energy band gap compared to Ligands A to C. Thus, when manufacturing a light-emitting device using quantum dots, the light-emitting device of Example 1 exhibited easy charge injection compared to the light-emitting devices of Comparative Examples 1 to 3 (see FIGS. 5A to 5D and 6A to 6D).

Evaluation Example 2

Figure 7:
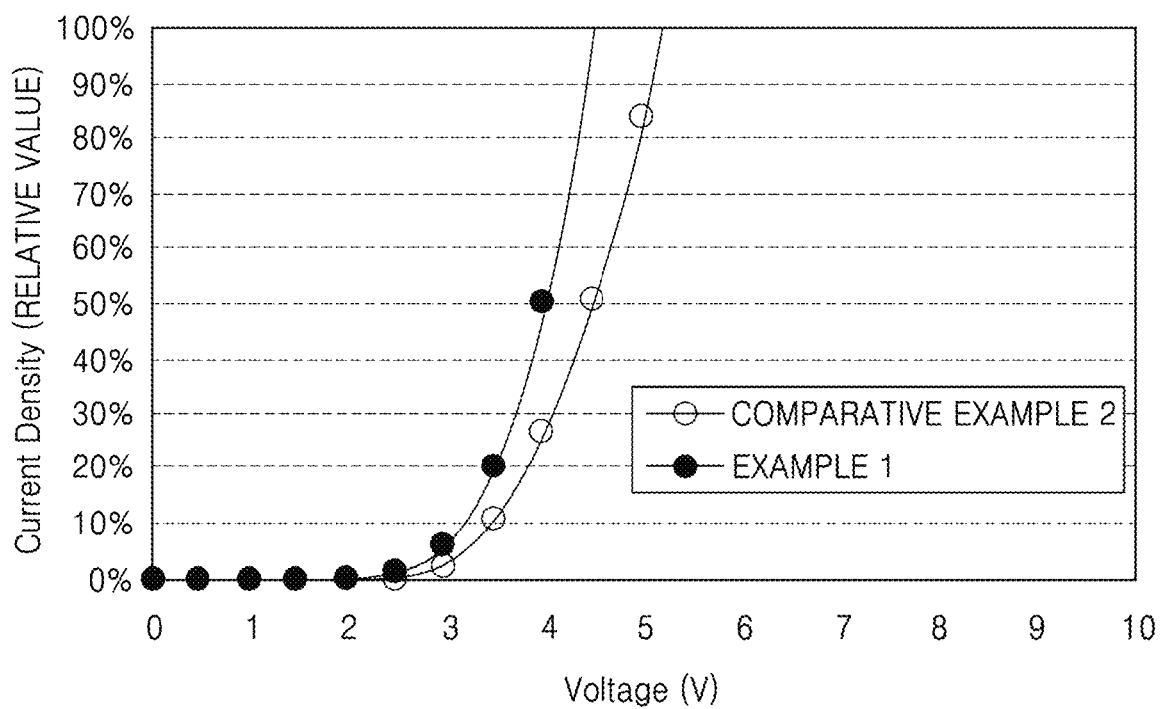
FIG. 7 is a graph of current density versus voltage of light-emitting devices of Example 1 and Comparative Example 2.
Figure 8:
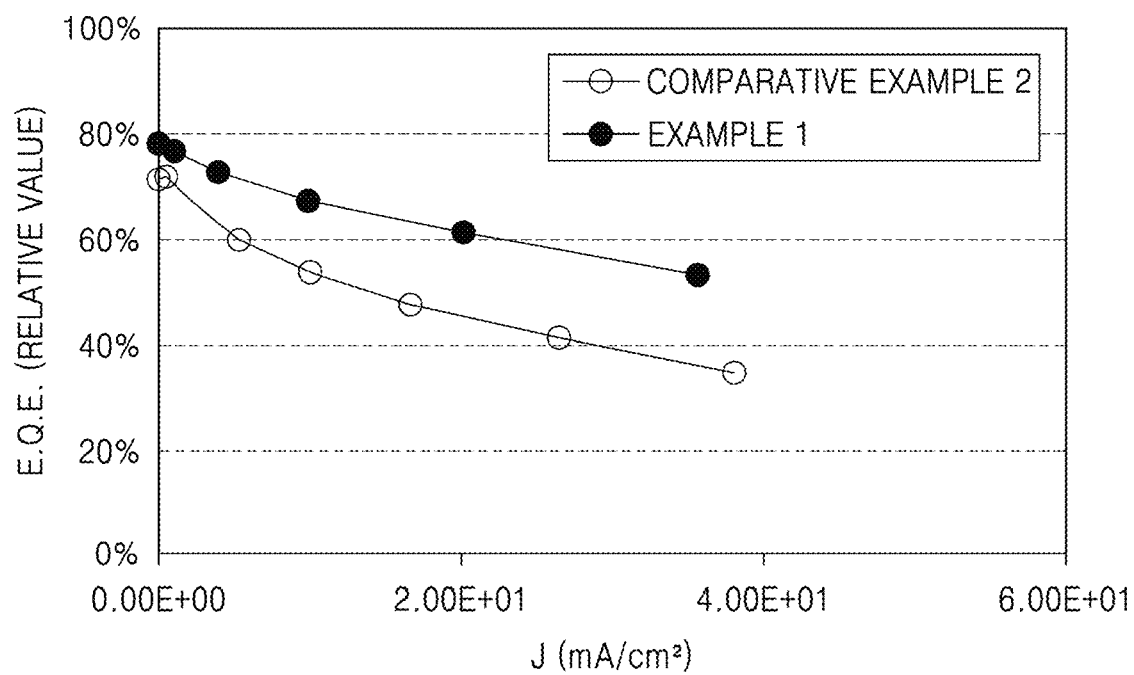
FIG. 8 is a graph showing external quantum efficiency of light-emitting devices of Example 1 and Comparative Example 2.

Regarding the light-emitting devices of Example 1 and Comparative Example 2, the current density versus voltage and the external quantum efficiency were measured, and results are each shown in FIGS. 7 and 8.

Referring to FIG. 7, it was confirmed that the light-emitting device of Example 1 showed a reduced driving voltage, and increased current density at the same driving voltage, compared to the light-emitting device of Comparative Example 2.

In addition, referring to FIG. 8, it was confirmed that, based on the current of 3.0 mA/cm$^2$, the light-emitting device of Example 1 exhibited efficiency improved by about 50% in comparison with the light-emitting device of Comparative Example 2, and also showed improvements in the roll-off phenomenon.

According to the one or more embodiments, a quantum dot introduces a ligand to a surface of a nanoparticle included in the quantum dot to facilitate charge injection, thereby reducing the difference between HOMO energy and LUMO energy levels. In this regard, a light-emitting device including the quantum dot and/or an apparatus including the quantum dot may have improved efficiency and a longer lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the claims and their equivalents.

What is claimed is:

1. A quantum dot comprising:
   a nanoparticle; and
   a ligand represented by Formula 1 on a surface of the nanoparticle:

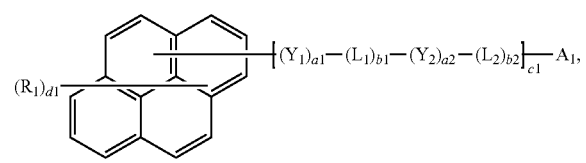

Formula 1 wherein, in Formula 1,
$A_1$ is a group comprising a thiol moiety, a bidentate thiol moiety, a dithio acid moiety, and/or a carboxylic acid moiety,
$Y_1$ and $Y_2$ are each independently selected from $N(R_2)$, S, and O,
a1 and a2 are each independently 0 or 1,
$L_1$ and $L_2$ are each independently $C(R_3)(R_4)$,
b1 and b2 are each independently an integer from 0 to 20,
a sum of a1, a2, b1, and b2 is 1 or more,
c1 is an integer from 1 to 6,
$R_1$ to $R_4$ are each independently selected from hydrogen, deuterium, —F, —Cl, —Br, —I, a hydroxyl group, a cyano group, a $C_1$-$C_{20}$ alkyl group, a $C_1$-$C_{20}$ alkoxy group, —NCO, —NCS, —OCN, —SCN, —C(=O)N$(Q_1)_2$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, and —P(=O)$(Q_1)(Q_2)$,
d1 is an integer from 0 to 9, and
$Q_1$ to $Q_3$ are each independently selected from hydrogen, a $C_1$-$C_{20}$ alkyl group, a $C_1$-$C_{20}$ alkoxy group, a phenyl group, a biphenyl group, a terphenyl group, a naphthyl group, and a pyridinyl group.

2. The quantum dot of claim 1, wherein $A_1$ is an anchoring group linked to the surface of the nanoparticle.

3. The quantum dot of claim 1, wherein $A_1$ is selected from groups represented by Formulae A-1 to A-4:

*—SH     A-1

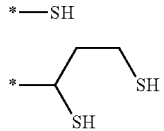

A-2

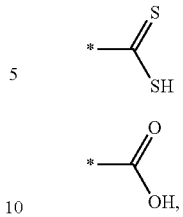

A-3

A-4 and
wherein * in Formulae A-1 to A-4 indicates a binding site to a neighboring atom.

4. The quantum dot of claim 1, wherein a sum of b1 and b2 is 1 or more.

5. The quantum dot of claim 1, wherein a sum of b1 and b2 is 2 or more.

6. The quantum dot of claim 1, wherein *—$(Y_1)_{a1}$-$(L_1)_{b1}$-$(Y_2)_{a2}$-$(L_2)_{b2}$-*' is selected from groups represented by Formulae L-1 to L-10:

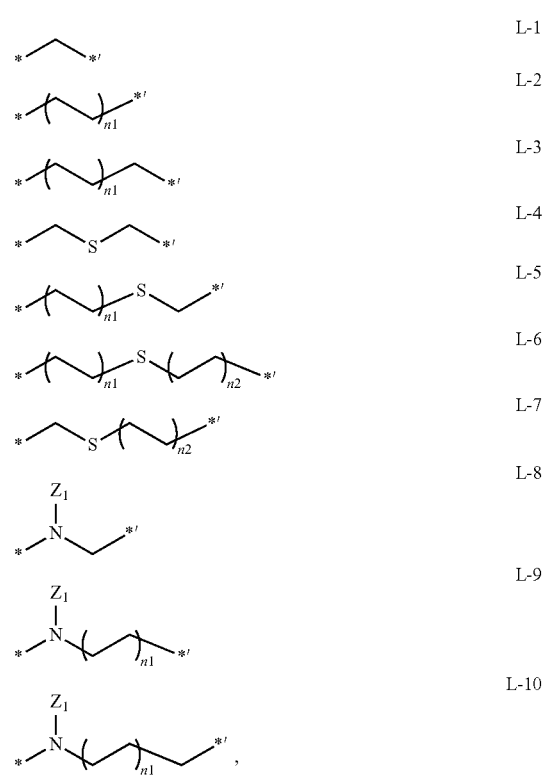

and
wherein, in Formulae L-1 to L-10,
n1 and n2 are each independently an integer from 1 to 20,
$Z_1$ is selected from hydrogen, deuterium, —F, —Cl, —Br, —I, a hydroxyl group, a cyano group, a $C_1$-$C_{20}$ alkyl group, and a $C_1$-$C_{20}$ alkoxy group, and
* and *' each indicate a binding site to a neighboring atom.

7. The quantum dot of claim 1, wherein $R_1$ to $R_4$ are each independently selected from hydrogen, deuterium, —F, —Cl, —Br, —I, a hydroxyl group, a cyano group, a $C_1$-$C_{20}$ alkyl group, and a $C_1$-$C_{20}$ alkoxy group.

8. The quantum dot of claim 1, wherein the ligand is selected from compounds represented by Formulae 1-1 and 1-2:

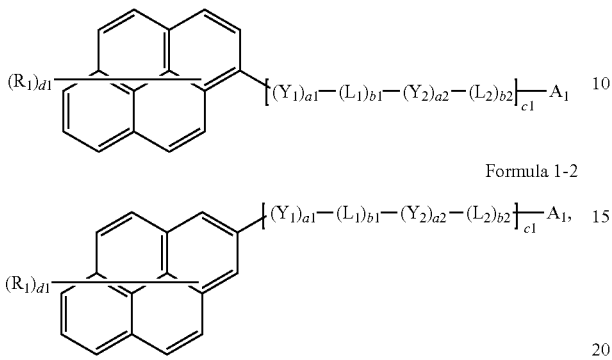

Formula 1-1

Formula 1-2 and
wherein, in Formulae 1-1 and 1-2,
$A_1$, $Y_1$, $Y_2$, a1, a2, $L_1$, $L_2$, b1, b2, c1, R1 to R4, and d1 are each the same as described in Formula 1.

9. The quantum dot of claim 1, wherein the ligand is at least one selected from Ligands 1 to 10:

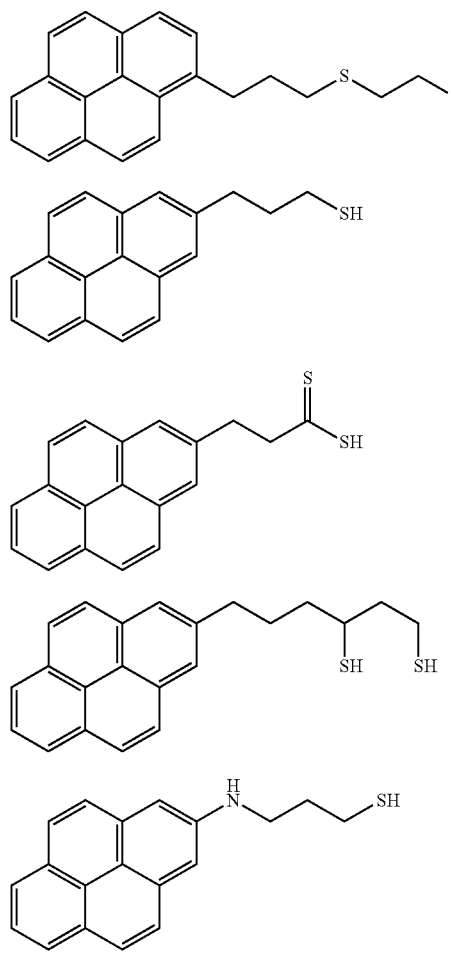

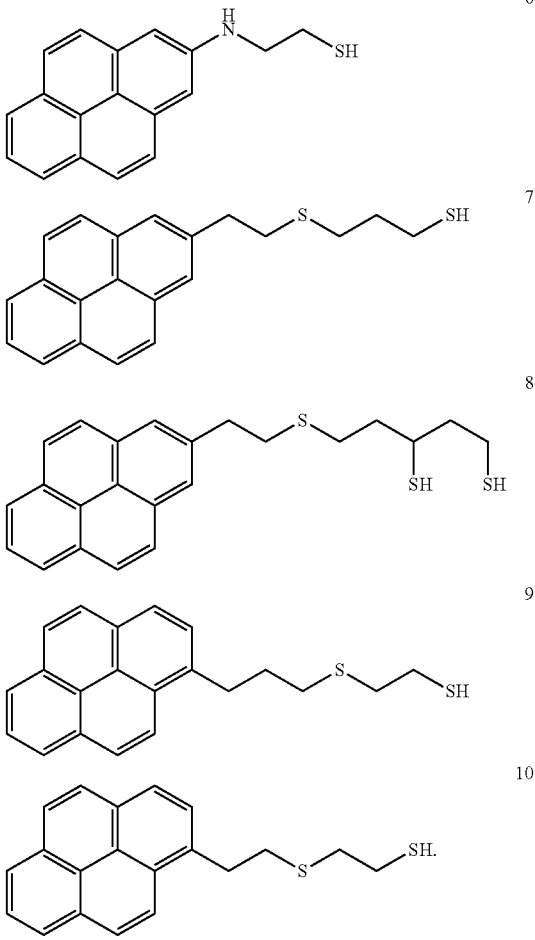

10. The quantum dot of claim 1, wherein the nanoparticle has a core-shell structure comprising a core and a shell, the core comprising a first semiconductor, and the shell comprising a second semiconductor, or
the nanoparticle is a perovskite compound.

11. The quantum dot of claim 10, wherein the first semiconductor and the second semiconductor each independently comprise a Group 12-16 compound, a Group 13-15 compound, a Group 14-16 compound, a Group 14 element and compound, a Group 11-13-16 compound, a Group 11-12-13-16 compound, or any combination thereof.

12. The quantum dot of claim 10, wherein the first semiconductor and the second semiconductor are each independently selected from:
CdS, CdSe, CdTe, ZnS, ZnSe, ZnTe, ZnO, HgS, HgSe, HgTe, MgS, MgSe;
CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe; CdZnSeS, CdZnSeTe, CdZnSTe, CdHgSeS, CdHgSeTe, CdHgSTe, HgZnSeS, HgZnSeTe, HgZn-STe;
GaN, GaP, GaAs, GaSb, AlN, AlP, AlAs, AlSb, InN, InP, InAs, InSb; GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InZnP; GaAlNP, GaAlNAs, GaAlNSb, GaAlPAs, GaAlPSb, GaInNP, GaInNAs, GaInNSb, GaInPAs, GaInPSb, InAlNP, InAl-NAs, InAlNSb, InAlPAs, InAlPSb;

SnS, SnSe, SnTe, PbS, PbSe, PbTe; SnSeS, SnSeTe, SnSTe, PbSeS, PbSeTe, PbSTe, SnPbS, SnPbSe, SnPbTe; SnPbSSe, SnPbSeTe, SnPbSTe;

Si, Ge, SiC, SiGe;

AgInS, AgInS$_2$, CuInS, CuInS$_2$, CuGaO$_2$, AgGaO$_2$, AgAlO$_2$; and any combination thereof.

13. The quantum dot of claim 10, wherein the first semiconductor comprises GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InZnP, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor comprises CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

14. The quantum dot of claim 1, wherein the nanoparticle has a surface modified by the ligand.

15. An ink composition comprising the quantum dot of claim 1 and a solvent.

16. A light-emitting device comprising:
a first electrode;
a second electrode facing the first electrode; and
an emission layer between the first electrode and the second electrode, wherein
the emission layer comprises the quantum dot of claim 1.

17. An optical member comprising the quantum dot of claim 1.

18. The optical member of claim 17, wherein the optical member is a color conversion member.

19. An apparatus comprising the quantum dot of claim 1.

20. The apparatus of claim 19, further comprising a light source, wherein the quantum dot is arranged in a path of light to be emitted from the light source.

* * * * *